US008570055B2

(12) United States Patent  
De Boer et al.

(10) Patent No.: US 8,570,055 B2  
(45) Date of Patent: Oct. 29, 2013

(54) CAPACITIVE SENSING SYSTEM

(75) Inventors: Guido De Boer, Leerdam (NL); Johnny Joannes Jacobus Van Baar, Hengelo (NL); Kaustubh Prabodh Padhye, Zoetermeer (NL); Robert Mossel, Capelle a/d IJssel (NL); Niels Vergeer, Rotterdam (NL); Stijn Willem Herman Karel Steenbrink, The Hague (NL)

(73) Assignee: Mapper Lithography IP B.V., Delft (NL)

( * ) Notice: Subject to any disclaimer, the term of this patent is extended or adjusted under 35 U.S.C. 154(b) by 258 days.

(21) Appl. No.: 12/977,240

(22) Filed: Dec. 23, 2010

(65) Prior Publication Data

US 2011/0193574 A1     Aug. 11, 2011

Related U.S. Application Data

(60) Provisional application No. 61/291,411, filed on Dec. 31, 2009.

(51) Int. Cl.
 *G01R 27/26* (2006.01)

(52) U.S. Cl.
 USPC .................. 324/686; 324/658; 324/688

(58) Field of Classification Search
 USPC ........................... 324/658, 686, 688
 See application file for complete search history.

(56) References Cited

U.S. PATENT DOCUMENTS

| 4,538,069 A | 8/1985 | Shambroom |
| 4,766,368 A * | 8/1988 | Cox .............................. 324/688 |
| 5,539,323 A | 7/1996 | Davis, Jr. |
| 5,844,486 A | 12/1998 | Kithil |
| 2004/0182168 A1 | 9/2004 | Mallory |
| 2005/0001180 A1 | 1/2005 | Lyons |
| 2005/0118859 A1 | 6/2005 | Wakamatsu |
| 2008/0100425 A1 | 5/2008 | Kiribayashi |

FOREIGN PATENT DOCUMENTS

| EP | 1602892 A1 | 12/2005 |
| GB | 2131176 A | 6/1984 |
| JP | 9061272 A | 3/1997 |
| WO | 8908352 A1 | 9/1989 |

OTHER PUBLICATIONS

Search Report from PCT/EP2010/070888 issued by the EPO.

* cited by examiner

*Primary Examiner* — Vincent Q Nguyen

(74) *Attorney, Agent, or Firm* — Hoyng Monegier LLP; David P. Owen; Coraline J. Haitjema

(57) ABSTRACT

A capacitive sensing system with a sensor having a thin film structure. The thin film structure includes a first insulating layer and a first conductive film having a sensing electrode formed on a first surface of the first insulating layer and a second conductive film having a back guard electrode. The back guard electrode is formed in a single plane and has a peripheral portion in the same plane, and is disposed on a second surface of the first insulating layer and a first surface of a second insulating layer or protective layer. The peripheral portion of the back guard electrode extends beyond the sensing electrode to form a side guard electrode which substantially or completely surrounds the sensing electrode.

20 Claims, 25 Drawing Sheets

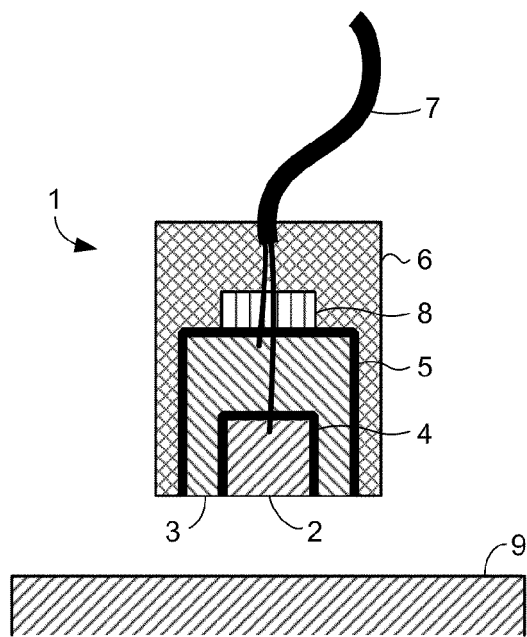
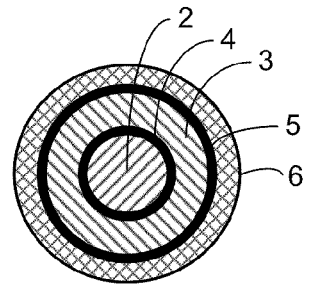
FIG. 1A              FIG. 1B
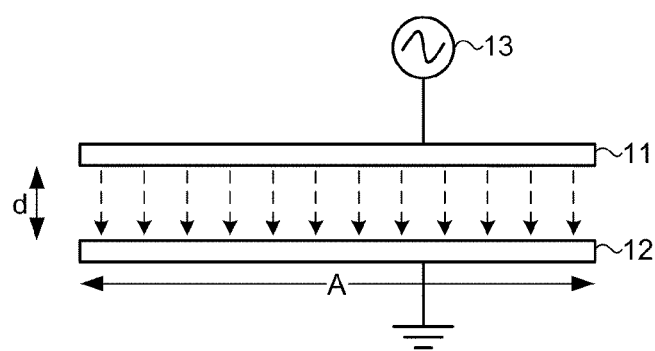
FIG. 2

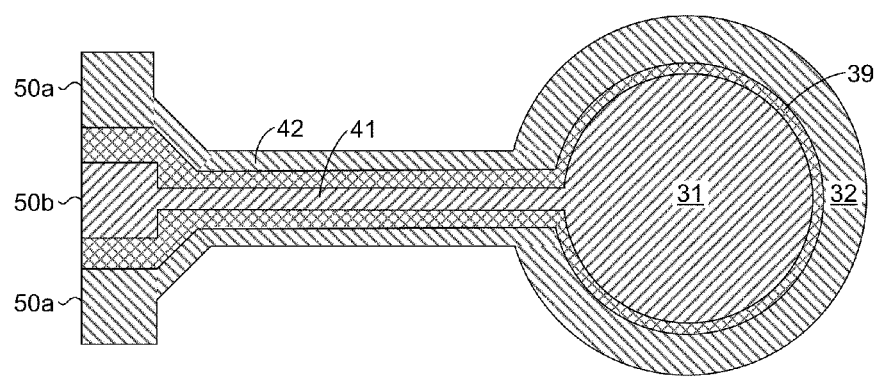
FIG. 11
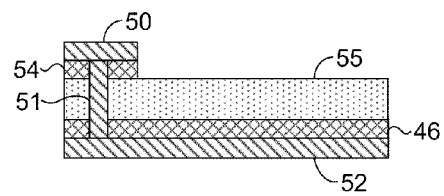
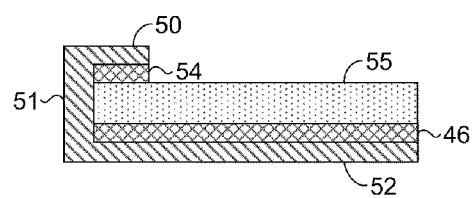
FIG. 12A          FIG. 12B

CAPACITIVE SENSING SYSTEM

BACKGROUND OF THE INVENTION

1. Field of the Invention

The present invention relates to a capacitive sensor for measuring distance, in particular capacitive sensor for measuring distance to a target in a lithography apparatus.

2. Description of the Related Art

Charged particle and optical lithography machines and inspection machines are used to expose patterns onto wafers and other targets, typically as part of a semiconductor device manufacturing process. In a lithography system a wafer is usually exposed at multiple locations by optical or particle exposure beams generated by the lithography machine. The wafer is usually positioned on a wafer table and multiple exposures are typically achieved by controlled displacement of the wafer table with respect to a stationary electron/optics column. The exposures are typically performed continuously on the wafer surface.

The wafer surface which is to be exposed is almost never completely flat. A typical wafer may have a bow in it of up to 50 μm without clamping to the wafer table. Apart from the wafer bow the wafer surface may have other non-uniformities over its surface. The wafer bow and other non-uniformities result in height variations in the wafer surface. To achieve the extremely high precision required of modern lithography machines, it necessary to correct for this height variation to maintain the wafer surface that is exposed in the focal plane of the projection lens used to focus the optical or particle exposure beams onto the wafer.

The wafer table that holds the wafer may be adjusted to compensate for these variations in height of the wafer surface. The height of the wafer table may be adjusted to bring the wafer surface to be exposed into the focal plane of the projection lens. Control of the wafer table height may be accomplished using signals transmitted from sensors which measure the height of the wafer surface, e.g. the distance between the projection lens and the wafer surface. Highly sensitive sensors are required to ensure correct control of wafer position at the extreme precision required for modern lithography machines. Various types of sensors have been used for this type of application, including capacitive probes. However, the existing capacitive probes and associated measurement and control systems have suffered from several drawbacks.

Existing capacitive sensors are typically large, both in height and sensor area. FIGS. 1A and 1B show the structure of a prior art capacitive sensor. FIG. 1A shows a cross-sectional view and FIG. 1B shows an end view of the sensor probe. A conductive sensing electrode 2 is surrounded by a conductive guard electrode 3. An insulating layer 4 separates the two electrodes and another insulating layer 5 may be used to separate the guard electrode 3 from the housing 6. An electrical cable 7 and connector 8 connects the sensor to a signal processing system to derive the desired final measurement signal. The operating range of the sensor is dependent upon the sensing area under the sensing electrode 2. The guard electrode 3 is set at the same potential as the sensing electrode to confine the electric field within the sensing area to generate a relatively uniform electric field between the sensing electrode 2 and the target 9. This type of construction leads to a relatively tall sensor, generally about 20 mm in height, and a relatively large sensing electrode.

The relatively large height and width of the sensors requires that the sensors need to be located relatively far from the projection lens, introducing errors due to variation in the relative positioning of the sensors and the projection lens due to manufacturing tolerances and thermal expansion. The relatively large size of existing capacitive probes also requires that individual sensors in multi-sensor configurations are spaced relatively far apart, reducing the spatial resolution of the sensing system so that non-uniformities in the wafer surface occurring over a small area of the wafer surface may not be detected. The relatively wide spacing also results in a slower measurement process, reducing throughput of a lithography machine using these systems.

British patent 2,131,176 describes a capacitance distance measuring probe manufactured by adhesively bonding together two thermoplastic polymer films with a copper coating deposited on one side, so that the copper coated face of one sheet is bonded to the uncoated face of the other sheet. The exposed copper coating on one sheet is divided into a first area which constitutes a sensing electrode and a second area which at least partially surrounds the sensing electrode and is electrically interconnected with a copper coating on the other sheet to define a guard electrode for the sensing electrode. This construction mimics the construction shown in FIG. 1 by providing a guard electrode surrounding the sensing electrode, both the guard electrode surrounding the sensing electrode formed on the same surface and at the same level of the layered device. This results in a structure which requires an electrical connection between different conductive layers and thus requires a more complex and costly manufacturing process.

Furthermore, the wiring connections to these sensors are difficult to make and the wiring introduces capacitances which affect the reading of the sensor and need to be taken into account, usually be calibrating the combined sensor and wiring installation. The requirement to calibrate existing sensors in combination with the sensor wiring requires recalibration whenever a sensor is replaced, making the replacement complex, time-consuming, and expensive.

U.S. Pat. No. 4,538,069 describes a method of calibrating a capacitance height gage for a single electron beam lithography machine for exposing reticles. The height gage is first calibrated in a calibration fixture using a laser interferometer, and the machine is then repositioned to the lithography station to expose a reticle and the distance to the reticle is measured with the capacitance gage. The capacitance gages are formed on a substrate which is secured to the bottom of the electron beam optics housing. The reticle target is grounded, the capacitance gages are driven by 180° out-of-phase signals, and the output signal from each gage is separately processed to generate four height measurement signals.

BRIEF SUMMARY OF THE INVENTION

The invention seeks to solve or reduce the above drawbacks to provide an improved capacitive sensing system, comprising a sensor having thin film structure, the thin film structure comprising a sensor having a first insulating layer and a first conductive film comprising a sensing electrode formed on a first surface of the first insulating layer and a second conductive film comprising a back guard electrode. The back guard electrode is formed in a single plane and comprises a peripheral portion in the same plane, and is disposed on a second surface of the first insulating layer and a first surface of a second insulating layer or protective layer. The peripheral portion of the back guard electrode extends beyond the sensing electrode to form a side guard electrode which substantially or completely surrounds the sensing electrode.

This sensor structure omits the separate side guard electrodes formed at the same level as the sensing electrode, and omits the electrical connection between the separate side guard electrode and back guard electrode while still achieving a highly accurate sensor design. In a thin film sensor of small dimensions as contemplated by the invention, this electrical connection makes the manufacturing process more complex and costly, requiring such measures as a via through the insulating layer or additional external wiring connections. The invention applies the insight that a side guard electrode may be formed from a peripheral portion of the back guard electrode, so that the side guard electrode and back guard electrode are formed as a single film in the same plane, e.g. formed on the same insulating layer surface. This design avoids the needs for the difficulty of making an electrical connection to a separate side guard electrode. The separate side guard electrode surrounding the sensing electrode within the same plane as the sensing electrode may be omitted on the basis of the combined realizations that the field lines of the back guard electrode extend transverse to the plane of the back guard electrode and the layer thickness of the insulating layer between the sensing electrode and the back guard electrode is of such shallow height that the guard electrode does not need to be at exactly the same height (i.e. in the same plane) as the sensing electrode. This sensor design deviates from the previous tubular designs and the thin film equivalent of this design which has a side guard electrode formed on the same plane as the sensing electrode, resulting in a simple and cheaply manufactured but accurate sensor that can be more commonly and easier applied.

The capacitive sensing system may further comprise an elongated connecting member comprising a flexible membrane on which conductive tracks are printed or affixed, the conductive tracks electrically connected to the sensing electrode and the back guard electrode of the sensor at one end and a connector at the other end. The insulating layer may comprise a first area where the sensing electrode is formed and a second elongated area on which the conductive tracks are formed.

The thin film structure may further comprise a third conductive film comprising a shield electrode disposed on a second surface of the second insulating layer. The thin film structure may further comprise an elongated connecting member comprising a flexible membrane on which conductive tracks are printed or affixed, the conductive tracks electrically connected to at least the sensing electrode and the back guard electrode of the sensing electrode, the back guard electrode, and the shield electrode (44) of the sensor at one end and a connector at the other end. The sensor may be connected to a triaxial cable, and the shield electrode may be electrically connected to an outer grounded electrical conductor thereof.

The capacitive sensing system may also comprise an AC power source for energizing the capacitive sensor, a signal processing circuit for processing signals from the sensor, and a triaxial cable for connecting the capacitive sensor to the AC power source and the signal processing circuit, wherein the cable has a center conductor, an outer conductor, and a shield conductor, the center conductor for electrically connecting the AC power source to the sensing electrode of the sensor, the outer conductor for electrically connecting to the back guard electrode of the sensor, and the shield conductor for electrically connecting the shield electrode of the sensor to a ground for the signal processing circuit at an end of the cable remote from the sensors.

In another aspect, the invention relates to a capacitive sensing system comprising a sensor having thin film structure, the thin film structure comprising a sensor having a first insulating layer, a first conductive film comprising a sensing electrode formed on a first surface of the first insulating layer, a second conductive film comprising a back guard electrode disposed on a second surface of the first insulating layer and a first surface of a second insulating layer, and a third conductive film comprising a shield electrode disposed on a second surface of the second insulating layer, The sensor is mounted to a structure and electrically connected to a triaxial cable, the shield electrode of the sensor being electrically connected to an outer conductor of the triaxial cable for making a connection to ground potential at an end of the cable remote from the sensors, and the shield electrode of the sensor is not electrically connected to the structure at the sensor.

The electrodes of the sensor may be connected to corresponding conductors of the triaxial cable via a thin film connector element. The electrodes of the sensor may be connected to the conductors of the cable via conductive tracks on the thin film connector, the conductive tracks electrically connected to at least the sensing electrode and the back guard electrode of the sensor at one end and a connector at the other end. One or more of the conductive tracks electrically connected to the back guard electrode may be arranged to overlie the conductive track connected to the sensing electrode, the conductive tracks electrically connected to the back guard electrode being wider so that a peripheral portion extends out from the edge of the conductive track connected to the sensing electrode, The system may further comprise one or more conductive tracks connected to a shield electrode of the sensor at one end and electrically connected to an outer ground potential electrical conductor of the cable at the other end. One or more of the conductive tracks electrically connected to the shield electrode may be arranged to overlie the conductive track connected to the back guard electrode and the conductive track connected to the sensing electrode.

The insulating layers of the capacitive sensing system may be shared with additional capacitive sensors, and the thin film structure may be flexible. The insulating layers may comprise Kapton sheets, or a pyrex substrate, or a silicon substrate with an insulating coating.

In a further aspect, the invention also relates to a lithography system for exposing a target, the system comprising a projection lens system for focusing an exposure beam onto the target, a moveable stage for carrying the target, a capacitive sensing system (according to any of the variations described above) for making a measurement related to a distance between the projection lens system and the target, and a control unit for controlling movement of the moveable stage to adjust a position of the target based at least in part on a signal from the capacitive sensing system.

BRIEF DESCRIPTION OF THE DRAWINGS

Various aspects of the invention will be further explained with reference to embodiments shown in the drawings wherein:

FIG. 1A is a cross sectional view of a capacitive sensor;

FIG. 1B is an end view of the capacitive sensor of FIG. 1A;

FIG. 2 is a simplified schematic diagram of a parallel plate electrode arrangement;

FIG. 11 is a top view of a sensor with connecting lines and contact pads;
FIGS. 12A and 12B are cross sectional views of contact pad structures.

DESCRIPTION OF ILLUSTRATIVE EMBODIMENTS

Figure 3:
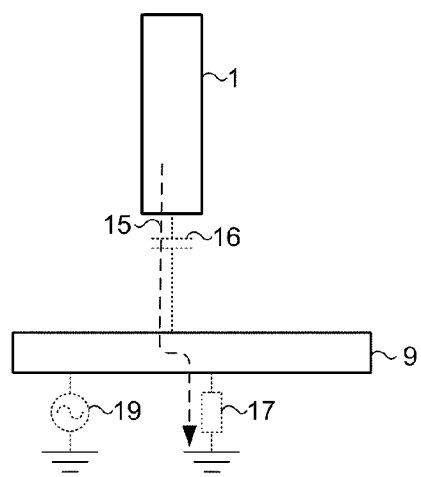
FIG. 3 is a diagram of a capacitive sensor probe and grounded conductive target.

The following is a description of various embodiments of the invention, given by way of example only and with reference to the drawings.

Theory of Capacitive Sensors

A capacitive sensor uses a homogeneous electric field set up between two conductive surfaces. Over short distances, the applied voltage is proportional to the distance between the surfaces. Single-plate sensors measure the distance between a single sensor plate and an electrically conductive target surface.

FIG. 2 shows a parallel plate electrode arrangement. The capacitance between the two electrodes 11, 12 is given by the charge induced on one of the electrodes due to a potential difference between the two electrodes, divided by the potential difference, as represented in equation (1), $$C = \frac{Q}{\Delta V}. \tag{1}$$

The two parallel electrodes are separated by a distance d. Capacitance between the two electrodes is given by equation (2), neglecting the effects of field bending and non-homogeneity of the dielectric, $$C = \frac{\varepsilon_0 \varepsilon_r A}{d} \tag{2}$$

where C is the capacitance between the two electrodes (F), A is the overlap area of the two electrodes (m$^2$), $\in_o$ is the permittivity of free space (8.85×10$^{-12}$ F/m), $\in_r$ is the relative permittivity of the medium between the electrodes, and d is the distance between the electrodes (m).

When an alternating electrical current source 13 is used to charge a parallel plate capacitor, a voltage potential develops between the electrodes depending on the impedance of the electrodes. The impedance of a parallel plate capacitance is given by equation (3), $$Z = \frac{1}{2\pi f C} \tag{3}$$

where Z is impedance (Ω), f is frequency (Hz), and C is capacitance (F).

From equation (3) it can be seen that capacitive impedance is inversely proportional to the value of the capacitance and frequency of the signal applied to the capacitor. In case of a capacitive sensor, the change in an electrical parameter (voltage or current) is measured which corresponds to the change in the impedance of the sensor. When the frequency of the signal applied to the sensor is kept constant, the impedance can be made inversely proportional to the change in capacitance. Equation (2) shows that the capacitance is directly proportional to the overlap area of the sensor electrodes and inversely proportional to the change in distance between the electrodes. Combining equations (2) and (3) yields the equation:

$$v = \frac{d}{2\pi f \varepsilon_0 \varepsilon_r A} \cdot i \quad (4)$$

where i=current.

By keeping the electrode overlap area and the frequency of the electrical signal (current) applied to the sensor constant, the change in distance between the electrodes results in a change in the impedance of the capacitive sensor. The voltage across the sensor will be proportional to the impedance, and proportional to the distance (d) between the sensor electrodes, enabling accurate measurement of the distance. Various measurement concepts may be used as described below.

Measurement Principle for Capacitive Sensor

FIG. 3 shows a single capacitive sensor probe 1 measuring the separation distance to grounded conductive target 9. When supplied with an AC current, current will flow along a path 15 from the sensor to the target through the sensor-target capacitance 16, and from the target to ground through the target-ground impedance 17. Disturbances from outside influences or variations which affect the distance measurement are represented in the diagram as the voltage 19, The accuracy of measurement of the distance from the sensor to the target depends on how accurately the sensor can measure the sensor-target capacitance 16. The capacitance of the target-ground impedance 17 will often greatly exceed the sensor-target capacitance 16, and may be over 100 times as much, when the target is not well grounded. This high capacitance results in a low impedance 17 so its effect on the sensor is small. However, variations the impedance 17 will affect the distance measurement and it is desirable to minimize this effect.

Figure 4:
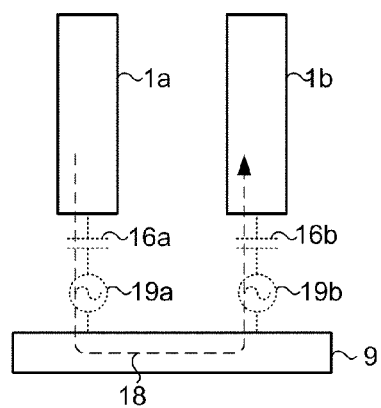
FIG. 4 is a diagram of two capacitive sensor probes in a differential measurement arrangement with a grounded conductive target.

FIG. 4 shows an arrangement of two capacitive sensor probes 1a and 1b for a differential measurement of the separation distance to target 9. The sensors are supplied with an AC current offset by 180 degrees, so that current will flow along a path 18 from one sensor to the target through the sensor-target capacitance 16a, and from the target to the other sensor through the other sensor-target capacitance 16b. This arrangement for driving the two sensors with out-of-phase signals is effective to avoid flow of current through the target to ground, and minimizes the effect of the target to ground impedance 17. It is also useful for an ungrounded target as it allows current to flow from one sensor to the other without needing a grounded return path. This arrangement of exciting the sensors with out-of-phase signals may be used in a conventional measurement system which derives a separate and independent capacitance (and distance) measurement from each sensor of the pair of sensors. Each sensor measures distance to the target individually. The disturbance 19 is represented in FIG. 4 by two disturbance voltages 19a and 19b, each of half the value of voltage 19 for a common mode disturbance that affects each sensor equally, A differential measurement arrangement can also be used in conjunction with the out-of-phase signals supplied to the sensors. In this arrangement, the outputs from the two sensors are coupled in such a way that the sensor-target capacitance 16a of sensor 1a is charged by the driving voltage of sensor 1a during its positive half cycle and also by the driving voltage of sensor 1b during its positive half cycle, whereas the sensor-target capacitance 16b of sensor 1b is charged by the driving voltage of sensor 1b during its negative half cycle and also by the driving voltage of sensor 1a during its negative half cycle. Thus, the output signal from each sensor corresponds to the average distance between the two sensors and the target.

The sensors are energized with a triangular voltage waveform with constant slope and amplitude, resulting in an approximately square wave current flow into the capacitance of the sensor, i.e. approximately constant positive current flow in one half cycle and approximately constant negative current flow in other half cycle. In practice the current will rise to a substantially steady state during each half cycle, so that measurements are preferably taken during the later part of each half cycle when the steady-state current flow is reached.

The current through the sensor and associated sensor capacitance can be measured and converted to a voltage for further processing. The resulting values for each sensor of the differential pair can be combined to reduce or eliminate common mode disturbances. For example, the steady-state current through sensor 1a during a positive current flow cycle is added to the steady-state current through sensor 1b during the positive current flow cycle can be summed, and similarly the steady-state current through sensor 1a during a negative current flow cycle is added to the steady-state current through sensor 1b during the negative current flow cycle can be summed. Subtracting the summed positive cycle value from the summed negative cycle value yields a differential sensor signal, i.e. Vdiff=(V1pos+V2pos)−(V1neg+V2neg).

Due to the close proximity and out-of-phase driving of the pair of sensors, the sensor current is charging and discharging both of the sensor-to-target capacitances 16a and 16b under the sensor pair, so that each measurement value is an average between the distance of each sensor to the target. This can be considered as the distance between the sensor pair and a point on the target mid-way between the two sensor. Each measurement value will be affected by any disturbances, e.g. disturbances 19a and 19b shown in FIG. 4. These disturbances are present in both the positive cycle values and the negative cycle values, but are essentially removed from the measurement by subtracting the positive and negative values to give the differential sensor signal. The advantage of this arrangement is that the common mode disturbances on the individual sensors are canceled out during the measurement. Any differences in the two sensors which remains constant during the measurement will be canceled out to result in an accurate measurement. The differential measurement arrangement greatly reduces the influence of the target-ground capacitance and increases the sensitivity of the sensing system.

Structure of Sensors

Figure 5:
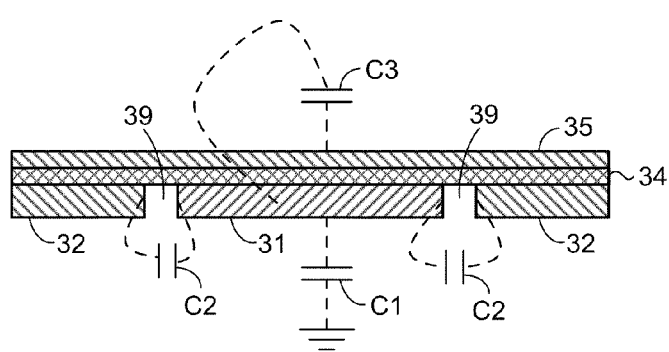
FIG. 5 is a cross sectional view of a capacitive sensor comprising a thin film structure.

FIG. 5 shows a cross-sectional view of a capacitive sensor comprising a thin film structure. The conductive sensing electrode 31 and conductive side guard electrode 32 are formed on or attached to an insulating film 34. A conductive back guard electrode 35 is disposed on the back side of the insulating film 34. The gap 39 between the sensing electrode and guard electrode is narrow, typically a few tenths of micrometers, and may be an air gap or filled with an insulating material.

The electric field generated between the sensing electrode and the target bends near the edges of the sensing electrode. The presence of a conductor near the edge of the sensing electrode can have a large and unpredictable effect on the electric field and thus on the sensor's measurement. To avoid this situation (and make the sensor measurement more predictable and easier to model so the electric field can be calculated analytically) the sensing electrode is surrounded by a guard electrode which is energized by the same potential as the sensing electrode. The guard electrode functions as a shield against external interference and also moves the electric field bending effects out of the sensing area under the sensing electrode, reducing parasitic capacitance. An electric field is generated between the guard electrode and the target on each side of the electric field between the sensing electrode and the target. There is no electric field generated between the sensing electrode and guard electrode since they are at the same potential. This results in a substantially homogeneous electric field in the area under the sensing electrode while the field bending occurs at the outside edges of the guard electrodes.

The area of the sensing electrode 31 should be large in comparison to the distance separating the sensing electrode from the target. Also, the gap 39 between the sensing electrode 31 and the side guard electrode 32 should be small in comparison to the distance between the sensing electrode and the target, and the width of the side guard electrode 32 should be large in comparison to the distance between the sensing electrode and the target. In one embodiment, the width of the sensing electrode is at least five times the distance between the sensor electrode and the target, the gap between the sensing electrode and the guard electrode is less than or equal to one fifth of the distance between the sensor electrode and the target, and the width of the guard electrode is at least five times the distance between the sensing electrode and the target. Following these comparative design rules provides an embodiment of the capacitive sensor design rules with a highly predictable capacitance, e.g. a predictability of the capacitance of 1 ppm. Predictability is here defined as the relative error made if the ideal plate-distance capacitance formula of equation (2) above is used for calculating capacitance for finite electrode dimensions instead of infinite electrode dimensions.

In addition to the sensor capacitance $C_1$ between the sensing electrode and the target which is being measured, the sensor has intrinsic parasitic capacitances $C_2$ and $C_3$ between each of the separate elements of the structure. The parasitic capacitances $C_2$ and $C_3$ are small in comparison to the capacitance $C_1$ being measured. In the embodiment of FIG. 5, the parasitic capacitances include capacitance $C_2$ between the sensing electrode and side guard electrodes and capacitance $C_3$ between the sensing electrode and back guard electrode.

In one embodiment of the sensor, the capacitance $C_1$ between the sensing electrode and target is 0.1 pF to 1 pF, while the parasitic capacitance $C_2$ between the sensing and side guard electrodes is a factor of 100 to 1000 times smaller, typically of the order of 0.001 pF (i.e. $10^{-15}$ F). The parasitic capacitance $C_3$ between the sensing electrode and back electrode is typically larger and dominates, typically about 1 to 1000 pF (i.e. $10^{-12}$ F to $10^{-9}$ F). The effect of these parasitic capacitances is reduced by energizing the guard electrode with the same potential as the sensing electrode. This can be accomplished by electrically connecting the side guard and sensing electrodes, or by the use of active guarding, discussed in more detail below. Active guarding may also be used for the back guard electrode.

Figure 6A:
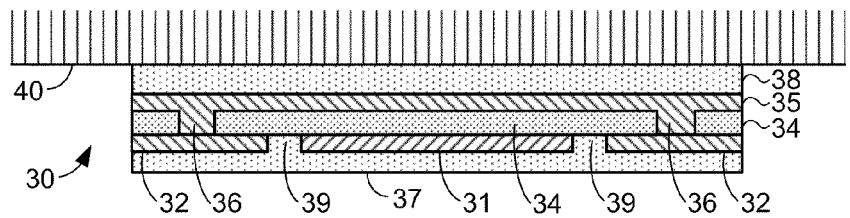
FIGS. 6A, 6B, 6C and 6D are cross sectional views of various embodiments of a thin film sensor.
Figure 6B:
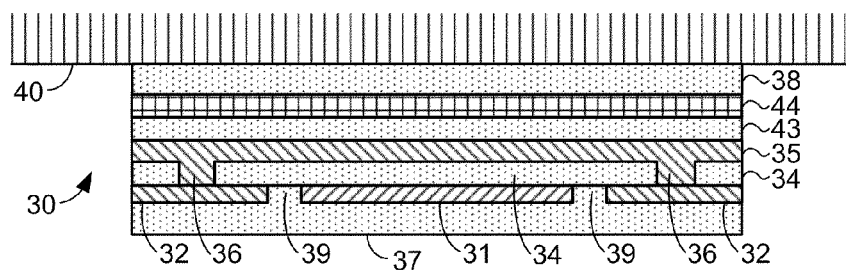

For applications with lithography machines operating in a clean environment in a vacuum chamber, the sensors are preferably constructed to give off very low levels of contaminants when in the vacuum environment. A protective layer may be formed over the conductors for sensors used in this type of application, such as a Kapton polyimide film or similar protective film, particularly where materials are used which may contaminate the vacuum environment. FIGS. 6A-6D show cross-sectional views of various embodiments of the thin film sensor including protective layers 37 and 38, and FIG. 6E shows a top view of the sensor of FIGS. 6A and 6B, and FIG. 6F shows a top view of the sensor of FIG. 6D.

FIG. 6A shows a cross-sectional view of an embodiment with a sensing electrode 31 and side guard electrode 32 formed on or attached to one surface of insulating film 34, and a back guard electrode 35 on the other surface of film 34. The sensor is attached to a plate 40 which is typically a part of the structure of the equipment requiring the distance measurement, or may be attached to part of the structure, e.g. a mounting plate or spacer plate around the projection lens of a lithography machine where the sensor is measuring the distance between the projection lens and a wafer under the lens. The plate 40 may be conductive, and thus can also serve as a shield electrode for the sensor.

FIG. 6B shows an alternative embodiment having a conductive shield electrode 44 formed on or attached to second insulating film 43 as part of the structure of the sensor. This construction enables the sensor to be mounted to a non-conductive surface. Even if mounted to a conductive surface, it ensures consistency in the extent and functioning of the shield electrode. The inclusion of the shield electrode 44 as part of the sensor structure also provides an independent ground potential that otherwise might obtained from the supporting surface. For example, when the sensor is used on an electron beam lithography system, the ground potential from the machine may be affected by electrical noise from the projection lenses. It also enables the sensor shield electrode to have the same ground as the measurement circuitry and the cables connecting the sensor to the circuitry.

This can be accomplished by connecting the sensor shield electrode to a shield conductor in the connecting cable which is then connected to a ground point used by the measurement circuits. This avoids having separate grounds for the sensor and the measurement electronics. When connected to a three conductor cable, e.g. a triaxial cable, this construction also enables connection points arranged for connection between each of the three conductive layers of the sensor and a corresponding conductor of the triax cable, including the shield electrode, including a connection of the shield electrode to a shield conductor of the triax cable to provide an independent ground potential to the sensor from the circuitry.

Figure 6C:
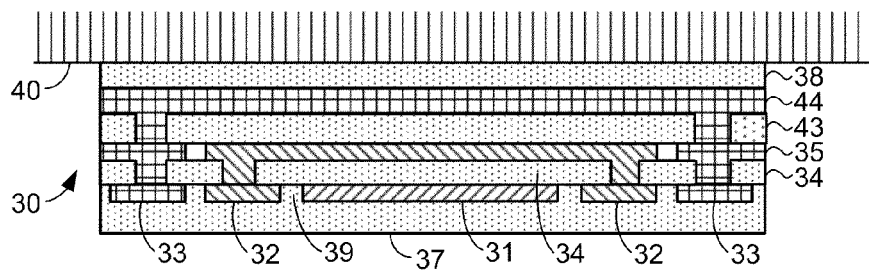

FIG. 6C illustrates another embodiment including an outer side guard electrode 33 electrically connected to the shield electrode 44. This connection may be made by forming holes or vias in the insulating layers 34 and 43, e.g. by laser, to permit electrical connection between portions of conductive layers on each level.

Figure 6D:
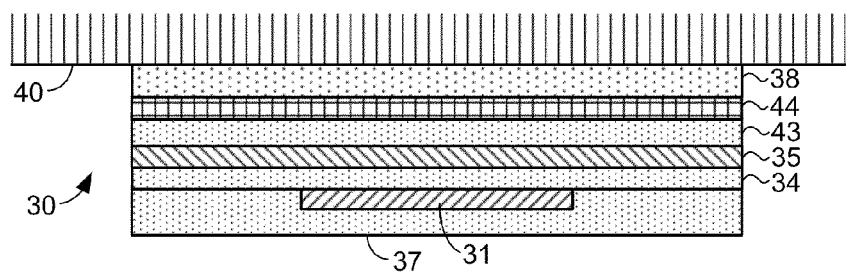
Figure 6E:
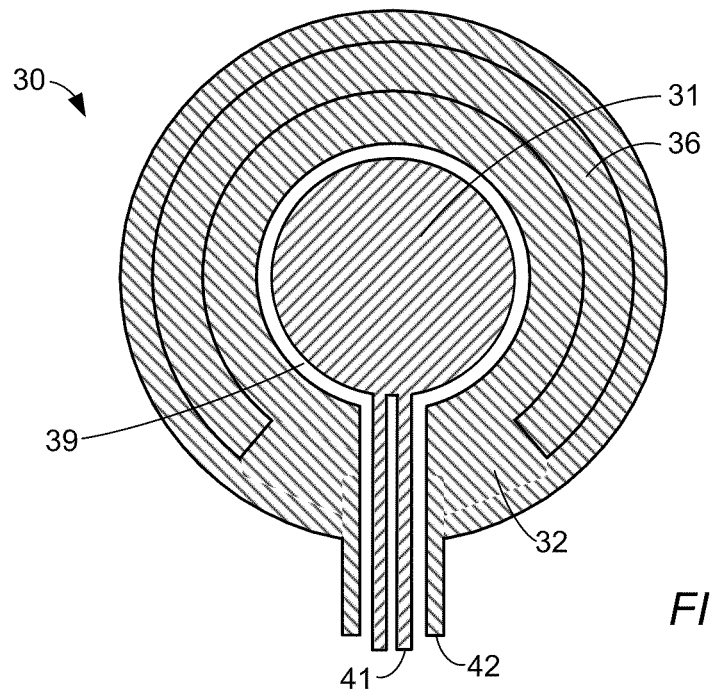
FIG. 6E is a top view of the sensor of FIGS. 6A and 6B.
Figure 6F:
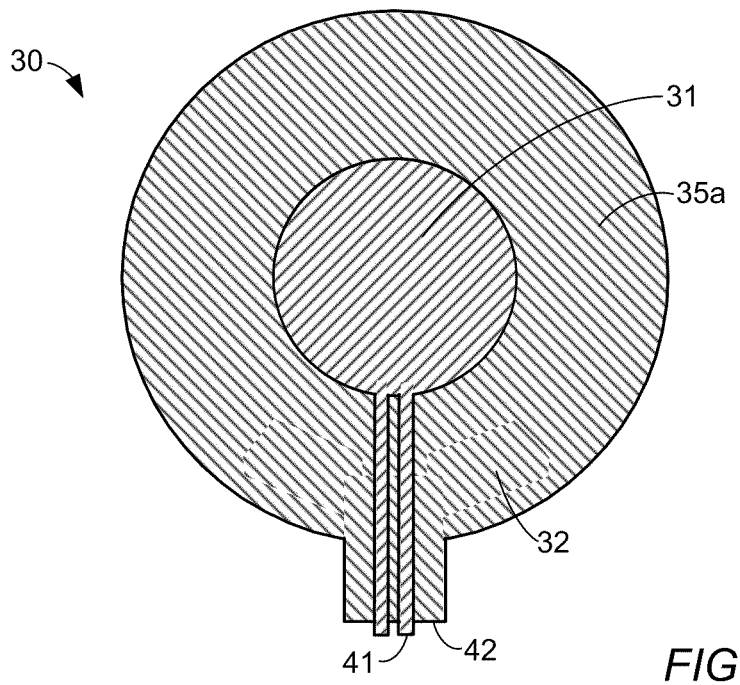
FIG. 6F is a top view of the sensor of FIG. 6D.

FIG. 6D depicts another embodiment without side guard electrodes on the same level or surface as the sensing electrode. Side guard electrodes have always been considered necessary in prior designs, as discussed above, to confine the electric field generated by the sensing electrode within the sensing area so that a relatively uniform electric field is generated between the sensing electrode and the target and reducing the effect on the sensor of conductors positioned near to the sensor. A guard electrode which extended down to the same plane as the sensor electrode to surround the sensor electrode was required in prior constructions which were relatively tall and large, e.g. as shown in FIG. 1A. Side guard electrodes were similarly considered essential in thin film designs to place a guard electrode at the same level as the sensor electrode. The side guard electrodes are preferably electrically connected to the back guard electrode, but this arrangement requires making an electrical connection between these two electrodes which presents difficulties. In the designs shown in FIGS. 6A-6C, this connection is made through the insulating layer 34. Due to the small size of the sensor and thinness of the insulating layer 34, accurately making holes of the right size and position in the insulating layer is difficult. A laser may be used to for this purpose, but the manufacturing process becomes more complex and costly.

However, if the films of the thin film sensor are sufficiently thin, it has been found that the side guard electrodes at the same level as the sensing electrode are not needed. The same effect can be achieved by designing the sensor with a sensing electrode 31 smaller than the back guard electrode 35, so that a peripheral portion of the back guard electrode extends laterally beyond and surrounds the sensing electrode. This peripheral portion of the back guard electrode then performs as a side guard electrode. The electrical field emanating from the peripheral portion of the back guard electrode 35 extends through the insulating layer 34, operating to confine the electric field generated by the sensing electrode within the sensing area so that a relatively uniform electric field is generated between the sensing electrode and the target. Electric field bending caused by a conductor placed near to the sensor occurs at the outside edges of the peripheral portion of the back guard electrode rather than at the sensing electrode. The result is a simpler design which is less complex to manufacture and so cheaper to produce, but which can generate a substantially homogeneous electric field in the area under the sensing electrode with reduced sensitivity to disturbances caused by a conductor positioned near to the sensor.

A top view of the embodiments of FIGS. 6A and 6B is shown in FIG. 6E, where the sensing electrode 31 is formed in a circular shape, with a "C" shaped side guard electrode 32 almost completely surrounding the sensing electrode, leaving a narrow gap between the two electrodes around the periphery of the sensing electrode 31. In this embodiment the side guard electrode 32 and back electrode 35 are optionally electrically connected, by means of an opening 36 in the insulating film 34 permitting the guard and back electrodes to come into electrical contact. A single "C" shaped opening is used in this embodiment, although other shapes could be used and/or multiple openings could be used. Connecting the guard and back electrodes puts both electrodes at the same potential to eliminate the effect of any capacitance between them, and by using active guarding the effect of any capacitance between the guard and back electrodes and the sensing electrode can also be eliminated.

In the embodiment in FIG. 6E, the internal sensing electrode 31 has one or more extensions forming connecting lines 41 for making an electrical connection from the sensing electrode to external signal processing circuits, and the side guard electrode 32 similarly has one or more extensions forming connecting lines 42 for making electrical connections. The sensing electrode 31, side guard electrode 32, and connecting lines 41 and 42 are formed from thin films. In the embodiment shown, the electrodes 31 and 32 and connecting lines 41 and 42 are all in the same plane, and may be formed from the same thin film by depositing or forming the film removing portions using a laser, by etching, or other suitable removal techniques. The side guard electrode 32 substantially surrounds the sensing electrode 31, leaving a small gap for the connecting lines 41 to extend outwards from the sensing electrode to provide an electrical connection between the sensing electrode and the signal processing circuits. The connecting lines also add parasitic capacitances that should be taken into account in the design of the sensor.

A top view of the embodiment of FIG. 6D is shown in FIG. 6F (the insulating layer 34 is not shown so that the back guard electrode 35 can be seen). This is similar to the embodiment of FIG. 6E except that for the absence of the side guard electrodes at the same level as the sensing electrode. In this view the peripheral region 35a of the back guard electrode 35 functions as a side guard electrode. The sensor may be constructed in the same way as the embodiment of FIG. 6E described above, and connecting lines 41 and 42 extend outwards from the sensing and back guard electrodes to provide electrical connections as describe above.

In these embodiments, the electrodes 31 and 35, and electrodes 32 and 44 where they are included, may be formed from conductive layers about 18 micron thick, the insulating films 34 and 43 may be about 25 micron thick, and the protective layers 37, 38 may be about 50 micron thick. The thin film sensor may be constructed with a total thickness of about 100-200 microns, and a thickness between the back surface of the sensor structure and the front surface of the sensing electrode (i.e. the surface facing the direction in which the distance measurement is taken) of 50-150 microns, preferably about 100 microns. The thin film structure, the small area, and the very small height (thickness) of the sensor makes it possible to apply the sensors in applications where there is very little room available (particularly where the available height is limited), and where close spacing between sensors or between sensors and other equipment is required.

The small size of the thin film sensor shown in FIGS. 6A-F (and also shown in other embodiments described below) provides many advantages. The thin film structure results in minimal height, and the width or area of the sensor may also be very small. This enables the sensor to be mounted in close proximity to the point at which the distance measurement is desired. When used with a lithography machine for measuring the distance between the projection lens and the target being exposed, the sensors can be mounted next to the projection lens and on the same mounting structure so that both the sensors and the projection lens are fixed to the same reference point. This greatly reduces errors due to relative movement between the sensors and projection lens, eliminates the need for correction for sensor mounting variation, and reduces requirements for calibration. The small size of the sensor also reduces flatness requirements for the sensor itself.

FIGS. 7 and 8 show additional embodiments of the thin film sensor with the insulating layer 34 formed only between the sensing electrode 31 and back electrode 35, so that the side guard electrode 32 and back electrode 35 can directly connect to each other.

Figure 7A:
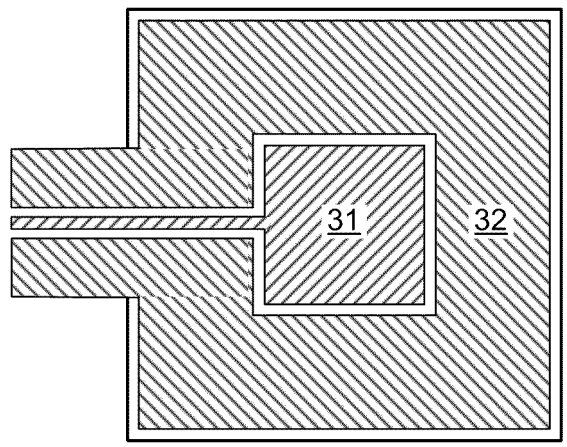
FIG. 7A is a top view of a thin film sensor with a square sensing electrode.
Figure 7B:
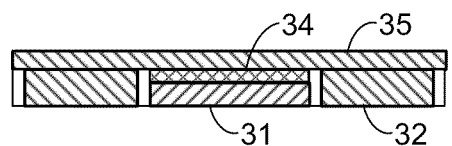
FIG. 7B is a cross sectional view of the sensor of FIG. 8A.

FIG. 7A shows a top view and FIG. 7B shows a cross-sectional view of the sensor with square sensing electrode. In one embodiment the square sensor is designed with a nominal sensor capacitance (capacitance $C_1$ between the sensing electrode and the target) of 1 pF at a nominal distance of 100 microns between the sensor and target. The sensing electrode has a width of 3.5 mm (+/−0.01 mm) with area of 12.25 mm$^2$. The guard electrode has width 1.5 mm (+/−0.01 mm), and the gap between the sensing and guard electrodes is 0.015 mm (+/−0.001 mm). In another embodiment the sensor is designed with a nominal sensor capacitance of 10 pF at a nominal distance of 100 microns between the sensor and target. The sensing electrode has a width of 11 mm (+/−0.01 mm) with area of 121 mm$^2$. The guard electrode width and gap are unchanged at 1.5 mm (+/−0.01 mm) and 0.015 mm (+/−0.001 mm) respectively.

Figure 8A:
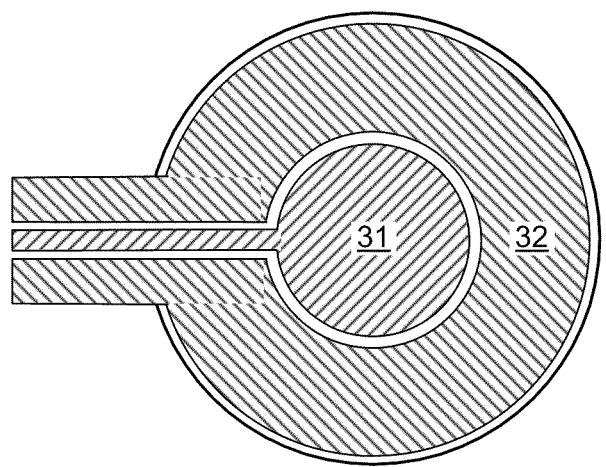
FIG. 8A is a top view of a thin film sensor with a circular sensing electrode.
Figure 8B:
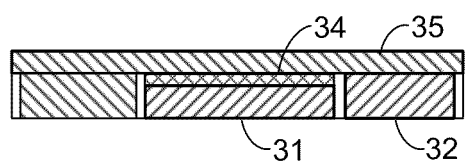
FIG. 8B is a cross sectional view of the sensor of FIG. 8A.

FIG. 8A shows a top view and FIG. 8B shows a cross-sectional view of the sensor with circular sensing electrode. In one embodiment the circular sensor is designed with a nominal sensor capacitance of 1 pF at a nominal distance of 100 microns between the sensor and target. The sensing electrode has a diameter of 4 mm (+/−0.001 mm) with area of 12.25 mm². The guard electrode has an inner diameter of 4.015 mm (+/−0.001 mm) and outer diameter of 8 mm (+/−0.001 mm). In another embodiment the sensor is designed with a nominal sensor capacitance of 10 pF at a nominal distance of 100 microns between the sensor and target. The sensing electrode has a diameter of 6.2 mm (+/−0.001 mm) with area of 121 mm². The guard electrode has an inner diameter of 6.215 mm (+/−0.001 mm) and outer diameter of 12.4 mm (+/−0.001 mm).

The embodiments of FIGS. 5-8 may be constructed to have a measurement range (in the z axis perpendicular to the sensing electrode surface) of 80-180 microns between the sensor and target. The dimensions of the sensors may be changed to accommodate a different measurement range, as will be appreciated by one of skill in the art.

The embodiments of FIGS. 5-8 may also be made using lithographic techniques to achieve even thinner layers of material, e.g. the sensing electrode 31 with thickness of 100 nm (+/−10 nm), the side guard electrode 32 (if included) and back electrode 35 of thickness 150 nm (+/−10 nm), and the insulating layer 34 of thickness 50 nm (+/−10 nm). The sensing electrode in these embodiments is square or circular, providing a large sensing area to maximize sensitivity of the sensor while minimizing the overall dimensions of the sensor. However, the sensor may deviate from these shapes, with a sensing electrode (and similarly guard electrodes) taking the form of a rectangle, oval or other shape to maximize the sensing area.

The embodiments in FIGS. 5-8 may be constructed with a conductive layer for the electrodes 31, 32 deposited onto the insulating layer 35 or affixed to the insulating layer with an adhesive or bonding layer. The gap 39 between the sensing and guard electrodes may be formed by forming a single conductive layer for both the sensing and guard electrodes and removing material using a laser or etching to create the gap. A laser is preferred for making very small gap widths, and can be used to make a 25 micron wide gap with small deviation, while etching is generally less precise.

The sensors can be manufactured using various techniques, for example using lithographic techniques, MEMS (Micro Electro Mechanical Systems) technology, or flexible printed circuit technology. Using flexible printed circuit technology, the insulating layer 34 may be provided as a flexible sheet or tape of suitable material, such as a Kapton polyimide film or similar flexible insulating film. The conductive electrodes 31, 32 and 35 may be formed of a thin layer of copper or other suitable conductive material, fixed to the insulating layer 34 using adhesive, formed as an adhesiveless laminate, e.g. those using a direct metallization process, or printed onto the insulating layer using conductive inks or other suitable printing techniques. The protective insulating films 37 and 38 may be formed of the same types of materials as layer 34.

The flexible printed thin film sensor is easy to manufacture and can be made quickly resulting in a short lead time for manufacture. The sensor can be made with robust connections from the sensor to the signal processing circuit. The small size provides more flexibility for placement at or very near the point where the distance is to be measured. The sensors can be glued in place as individual sensor elements to quickly and simply assemble the sensing system. The flatness and tilt of the individual sensors may be checked after they are glued in place and calibrated out in the measurement procedure. Where a flexible sheet of material is used for the insulation layers, the entire sensor can be constructed to be flexible.

The gap width between the sensing and side guard electrodes in some of the above embodiments above do not satisfy the comparative design rules described above, e.g. the gap between the sensing and guard electrodes is more than one fifth of the distance between the sensing electrode and the target. However, the advantages of the thin film structure will outweigh this for many applications of the sensors.

Figure 9A:
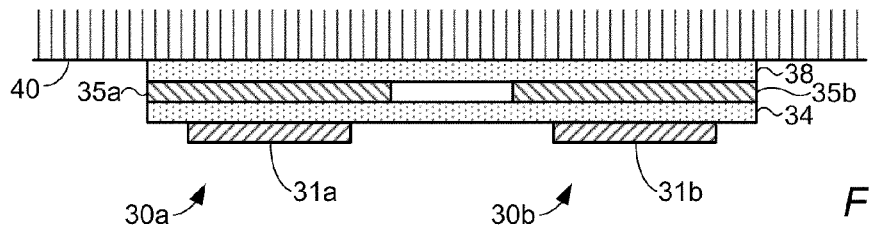
FIGS. 9A, 9B and 9C are cross sectional views of various embodiments of an integrated differential thin film sensor.
Figure 9B:
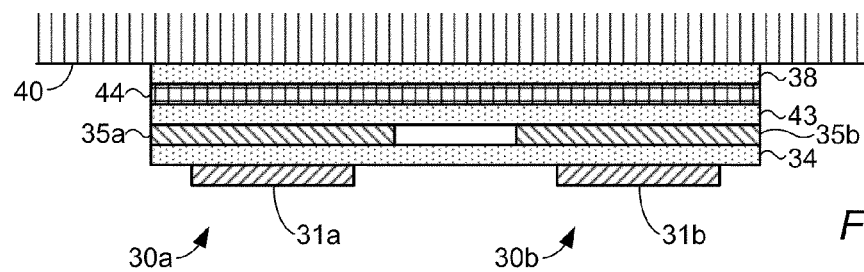
Figure 9C:
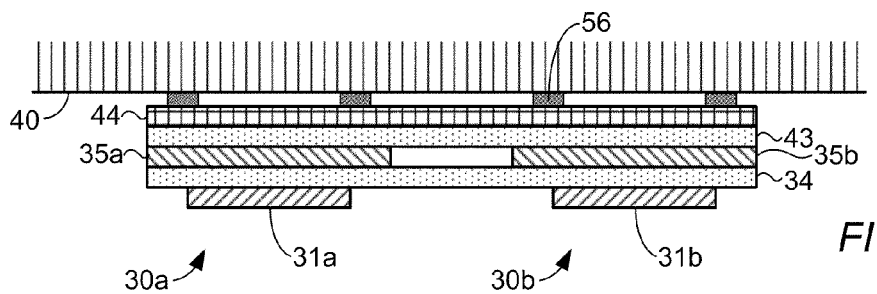

FIGS. 9A to 9C show various embodiments of a sensor pair constructed as a single integrated unit. In these embodiments, the integrated unit includes two sensors 30a and 30b, each having its own sensing electrode 31a, 31b and back guard electrode 35a, 35b. The sensor in FIG. 9A uses the conductive plate 40 as a shield electrode, and the sensors in FIGS. 9B and 9C share a single shield electrode 44 integrated with the sensor pair. In the embodiment of FIG. 9C, and sensor is fixed to the plate 40 using glue spots or lines 56 between the shield electrode 44 and plate 40. Where the plate 40 is conductive, a conducting glue may be used to electrically connect the plate 40 and shield electrode 44 to more effectively ground the shield electrode. The two sensors 30a, 30b are preferably operated as a differential pair as described above, where each sensor is driven by a voltage or current which is out-of-phase from the other sensor of the pair, preferably 180 degrees out-of-phase, and a differential measurement is made to cancel out common mode errors.

Figure 9D:
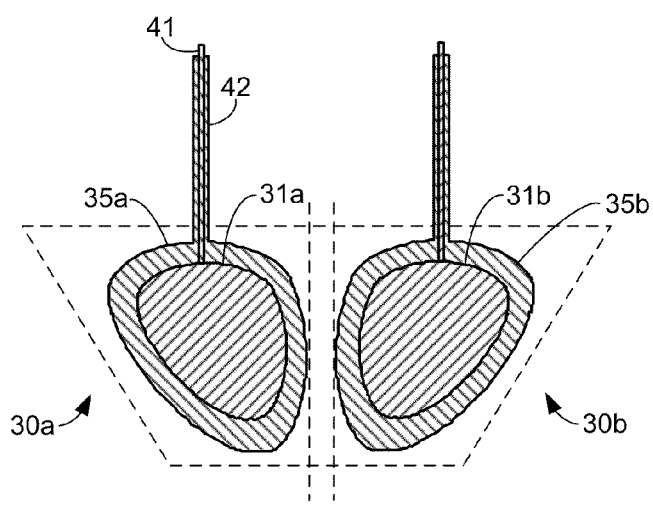
FIG. 9D is a top view of an integrated differential thin film sensor.

FIG. 9D shows a top view of a differential sensor pair. The back guard and sensing electrodes are formed in a rounded quadrilateral shape designed to fit within e.g. the areas 115 shown in FIGS. 20D and 21B. This shape results in the largest area for the sensing electrodes within the confines of the area 115 to produce the highest resolution measurements. The electrodes may also be formed into circular shapes also fitting closely within the area 115 to produce the largest area sensing electrodes.

FIGS. 10A to 10D show various configurations for a thin film capacitive sensor using different materials for the sensor substrate. These embodiments are suitable for construction using lithographic techniques, which allow the manufacture of very precisely shaped electrodes with very small gap sizes. This enables a sensor to be constructed to satisfy the comparative design rules described above, and having very high resolution for measuring very small features and very small distances. Lithographic processes also enable the connecting lines and contact/bond pads to be made with very small track widths and precise dimensions. Furthermore, lithographic processes are well known to those of skill in the art and once a process flow is developed can be readily applied in the manufacture of sensors having higher resolution. However, initial development of the process results in a longer manufacturing lead time, and will require short loop experiments to verify different process steps. FIGS. 10A-10D only show the arrangement of layers, and do not show a side guard electrode, but if included it would be formed on the same layer as the sensing electrode, and do not show the optional connection a side guard electrode and back guard electrode.

For applications where one or more sensors are mounted on a machine such as a lithography machine, the substrate in these embodiments may be common to more than one sensor so that a set of sensors are constructed in one unit. An example of this type of arrangement if shown in FIGS. 13A-13D and described below. The substrate may then be connected to a mounting plate or the substrate could be used as the mounting plate for mounting the sensors to the machine.

Figure 10A:
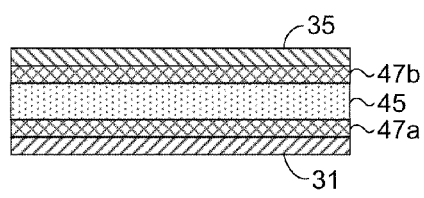
FIGS. 10A to 10D are cross sectional views of thin film capacitive sensors.

The embodiment in FIG. 10A has a silicon substrate 45 with insulating layers 47a, 47b formed on both sides. A sensing electrode 31 is formed on a surface of one of the insulating layers and a back guard electrode 35 is formed on a surface of the other insulating layer. This embodiment may require active biasing of the guard electrode to function effectively, which may require patterning of the plate on which the sensor is fixed. In addition, capacitive coupling between the projection lens and the sensors may be a problem.

Figure 10B:
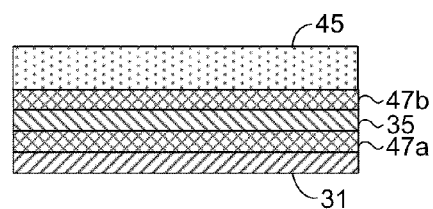

The embodiment in FIG. 10B has a silicon substrate 45 with multiple layers formed on one side, comprising a first insulating layer 47a, a sensing electrode 31 formed on the first insulating layer, a second insulating layer 47b, and a back guard electrode 35 formed on the second insulating layer. This embodiment avoids the need for patterning the mounting plate to which the sensor is fixed, and also avoids capacitive coupling between the projection lens and the sensors. However, an additional insulating layer is required compared to the embodiment of FIG. 10A.

The silicon substrate is not a good insulator so that insulating layers are included in these embodiments. A further disadvantage of the silicon substrate is that parasitic currents can be generated in the silicon due to impurities in the silicon, and these currents can disturb the capacitance measurement of the sensor.

Figure 10C:
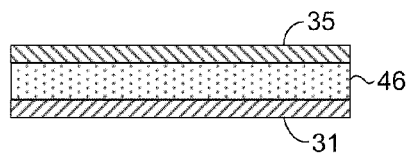

The embodiment in FIG. 10C has a pyrex substrate 46 with a sensing electrode 31 is formed on one surface and a back electrode 35 formed on the other surface. This embodiment also requires patterning of the plate on which the sensor is fixed if active biasing of the guard electrodes is implemented, although active guarding may be omitted with a decrease in sensitivity and an addition of a small amount of non-linearity in the sensor. An embodiment with this structure, with substrate thickness of 100 μm and gap between sensing electrode and side guard electrode of 16 μm, when energized with current of 50 μA at 150 kHz, may produce an effective output voltage of about 11.5V at a distance of 0.8 μm between sensor and target, and an effective output voltage of about 13.5V at a distance of 1.8 μm between sensor and target.

Figure 10D:
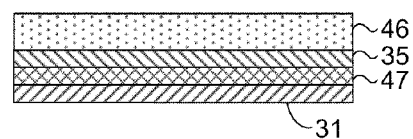

The embodiment in FIG. 10D has a pyrex substrate 46 with multiple layers formed on one side, comprising a guard electrode 35, an insulating layer 47 formed on the guard electrode, and a sensing electrode 31 is formed on the insulating layer. Patterning of the plate on which the sensor is fixed is not required for this arrangement, and capacitive coupling between the projection lens and the sensors is reduced due to the 100 μm Pyrex layer. Pyrex is a good insulator and the insulating layers used with the silicon embodiments can be omitted for the embodiments using a pyrex substrate.

Making the electrical connections between the sensor electrodes (sensing, side guard and back guard electrodes) and the signal processing system requires making a robust low impedance connection to the small sensor elements. The connection should be able to withstand the mechanical stresses expected, while avoiding the introduction of additional parasitic capacitances in the sensor arrangement. For sensor applications with lithography machines, the connections should also avoid use of materials that would give off contaminants into a vacuum environment.

FIG. 11 shows a sensor having contact pads 50a, 50b formed at the ends of connecting lines 41 and 42, for making external connections from the sensor to signal processing circuits. FIGS. 12A and 12B show cross sectional views of the structure of contact pads for making electrical contact to the sensor electrodes. These are particularly suited for the embodiments using substrates of silicon, pyrex and similar materials. These embodiments provide a contact pad on the back side of a substrate for electrically connecting to sensor electrodes on a front side of the substrate. FIG. 12A shows an embodiment with a via hole through a substrate 55. A conductive contact pad 50 is formed on a back side of the silicon substrate and a conductive connection 51 is formed through the via hole to connect with a conductive layer 52 on the front side of the substrate. FIG. 12B shows an embodiment with an electrical connection made over the edge of the substrate 55. A conductive contact pad 50 is formed on a back side of the substrate and a conductive connection 51 is formed at the edge of the substrate to connect with conductive layer 52 on the front side of the substrate.

For embodiments using a silicon or other non-dielectric substrate, an insulating layer 53 separates the conductive layer 52 from the substrate, and a small insulating layer 54 separates the contact pad 50 from the substrate. The via hole is also coated with an insulating layer in FIG. 12A, and the edge of the substrate under the conductive connection 51 is coated with an insulating layer in FIG. 12B. The additional insulating layer required for the contact pad gives rise to an additional small parasitic capacitance. For embodiments using a dielectric substrate such as pyrex, the additional insulating layers are optional and additional parasitic capacitances are reduced.

Figure 13A:
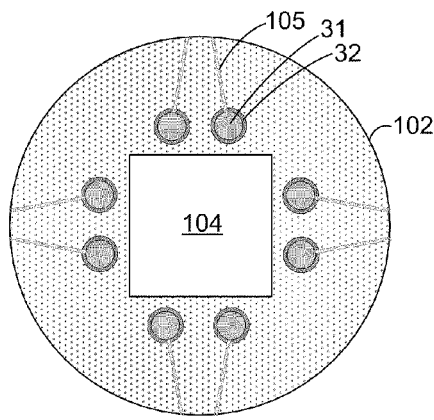
FIGS. 13A to 13D are diagrams of sensors, connecting lines and contact pads formed on a common substrate.

FIGS. 13A to 13D show an embodiment of a sensing system with multiple sensors constructed on a single substrate 102 surrounding a projection lens 104 of a lithography machine. FIG. 13A shows a front side of the substrate, i.e. the side facing downwards and towards the wafer to be exposed. Eight sensors (comprising four sensor pairs) are formed on the substrate spaced in pairs around the projection lens. In this embodiment, a conductive sensing electrode 31 is formed on the front side of the substrate for each sensor. A side guard electrode 32 surrounds each sensing electrode with a small gap formed between them. Connecting lines 105 make electrical connections between each sensing and guard electrode and the edge of the substrate. In this embodiment the substrate is made from a dielectric material such as pyrex or kapton, and no additional insulating layer is used between the electrodes and the substrate. A thin protective insulating layer may also be formed over the sensor electrodes on the front side of the substrate.

Figure 13B:
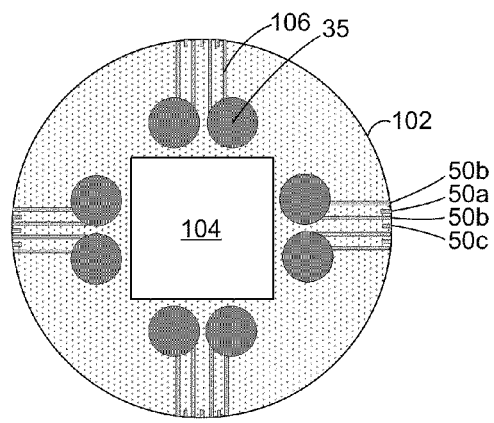

FIG. 13B shows the back side of the substrate, i.e. the side facing upwards away from the wafer to be exposed. A conductive back guard electrode 35 is formed on the back side of the substrate for each sensor. For each sensor, the back electrode is aligned with the sensing and side guard electrodes on the front side of the substrate. In this embodiment with circular electrodes, the centers of all of the electrodes are aligned for each sensor. The back electrode 35 has a larger diameter than the sensing electrode 31, and may be equal to or greater than the diameter of the side guard electrode 32 on the front side. Connecting lines 106 make electrical connections between the back guard electrodes and the edge of the substrate.

The connecting lines 105 on the front side and 106 on the back side of the substrate may be arranged to form contact pads 50a and 50b on the back side of the substrate at the edge, e.g. using the construction shown in FIG. 11, 12A or 12B, where contact pads 50a are electrically connected to the sensing electrodes 31 and the contact pads 50b are connected to the side guard electrodes 32 and back guard electrodes 35. In this embodiment, the contact pad areas alternate, with each contact pad 50a from a sensing electrode having a contact pad 50b from a corresponding side guard and back guard electrode on either side. An additional contact pad 50c is also formed at the edge of the substrate to connect to a shield electrode, which may be connected to a shield for the cable connecting the sensors to the measurement system. The contact pad areas together form contact pads 50, arranged in separate areas corresponding to the sensor pair arrangement on the substrate.

Figure 13C:
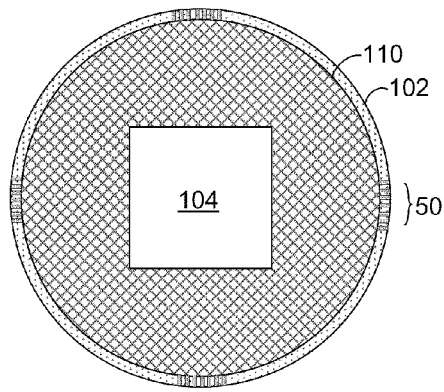
Figure 13D:
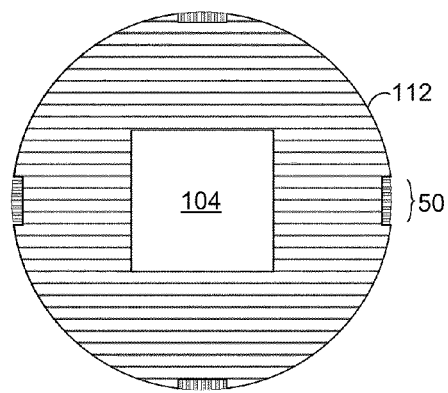

FIG. 13C shows the back side of the substrate with an insulating layer 110 formed over the substrate, leaving a gap around the edge of the substrate so that the contact pads 50 are exposed for making connections. FIG. 13D shows the substrate 102 mounted onto a spacer/mounting plate 112. The mounting plate 112 may be conductive and can function as a shield electrode, and may be grounded, or alternatively a conductive shield plate functioning as a shield electrode may be provided as a separate component. The contact pad 50c functions as a connecting area for making electrical connections to the shield electrode, e.g. to connect to the sensor shield. The insulating layer 110 electrically separates the guard electrodes from the mounting plate/shield electrode. In this embodiment the mounting plate has cut-outs around its edge to leave the contact pads 50 exposed for making electrical connections.

In one embodiment, the arrangement in FIGS. 13A-13D may comprise a pyrex substrate of 50 mm diameter with the square hole, e.g. 19×19 mm or 26×26 mm, to accommodate a projection lens. The sensing electrodes have a diameter 3.8 mm and a gap of 16 μm between the sensing and guard electrodes, the guard electrodes have a width of 1 mm, and the back electrodes a diameter of 6 mm. The connecting lines 105 have a width of 0.05 mm and a separation of 16 μm, and the connecting lines 106 have a width of 0.5 mm and a separation of 0.5 mm, and the contact pads may be 0.5 mm wide and 1.4 mm long, the pads separated from each other by a 0.5 mm gap. The sensor may be powered with a current of 10 μA at 200 kHz.

The sensors in the embodiment shown in FIGS. 13A-13D, or in any of the other sensor arrangements described herein, may be constructed according to any of the embodiments described, e.g. in FIG. 6A-F, 7A-B, 8A-B, 9A-C, 10A-D, 11 or 12A-B, and may be arranged in differential pairs where each sensor in a pair is driven by a voltage or current which is out-of-phase from the other sensor of the pair. For example, a first sensor of a pair may be driven by a current 180 degrees out-of-phase from the other sensor of the pair. To reduce coupling between pairs of sensors so that multiple differential pairs of sensors may be used together, each sensor pair may be driven by a voltage or current which is phase offset from the adjacent sensor pair. For example, adjacent pairs of sensors may be driven by a current 90 degrees out-of-phase from each other. For example, the pair of sensors at the top of FIG. 13A may be energized by currents at phase 0 and 180 degrees, while the pair of sensors on the right side and the pair on the left side are each energized at phase 90 and 270 degrees, and the pair of sensors at the bottom are energized at phase 0 and 180 degrees. In this way, a phase division technique is used with orthogonal biasing of adjacent sensor pairs, to separate the pairs and reduce interference between them. Other techniques, such as frequency division or time division may alternatively or additionally be used to reduce interference between sensor pairs.

Figure 14:
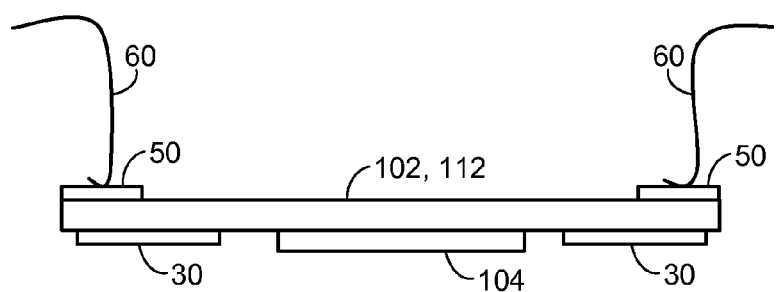
FIG. 14 is a side view of sensors mounted on a lithography machine.

An electrical connection from the sensor probes to a signal processing system is needed to transfer the electrical signals off the sensor and transmit them for converting the raw sensor signals into a usable format. FIG. 14 shows a side view of a sensor arrangement with sensors 30 mounted on a front side of a substrate 102 around a lithography machine projection lens 104. The substrate 102 may also function as a mounting plate 112 for mounting the sensors to the equipment from which a distance measurement is taken, e.g. the projection lens of a lithography machine. Contact pads 50 are formed on the back side of the substrate, and connection wires 60 in the form of metal contact springs make electrical contact with the pads to connect to a signal processing system.

Figure 15A:
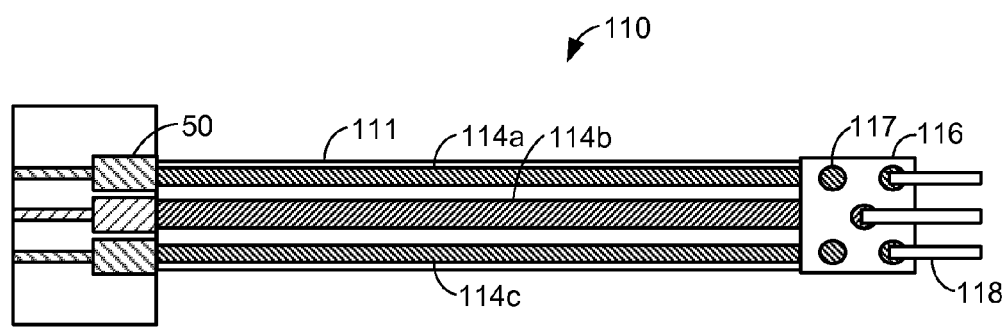
FIGS. 15A and 15B are diagrams of a flex print connector.
Figure 15B:
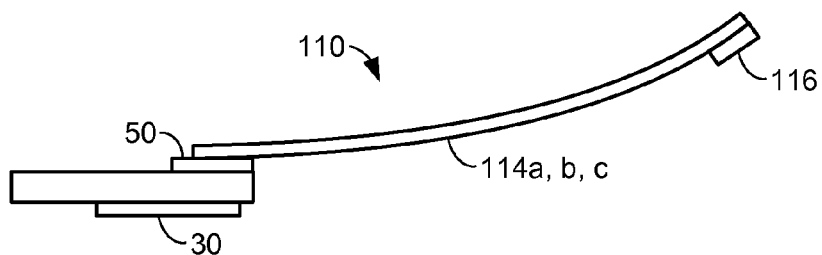

FIGS. 15A and 15B show an alternative connection arrangement using a flexible printed circuit connecting member 110, comprising a flexible membrane 111 on which conductive tracks 114a, 114b, 114c are printed or affixed. A protective insulating layer may be formed over the conductive tracks. One end of the flex print connector 110 is bonded to contact pads 50 or connecting areas of the sensor electrodes so that the conductive tracks make an electrical connection to the sensor electrodes. In the embodiment shown, conductive track 114a connects to a contact pad for the sensing electrode, and conductive tracks 114b and 114c connect to contact pads for the side guard electrode and/or back electrode. Where a shield electrode is included in the sensor structure, additional conductive tracks may be formed on the flex print connector to connect the shield electrode to a ground potential remote from the sensor and structure supporting the sensor. A connector plug or socket 116 is affixed to the other end of the flex print connector 110 with contact terminals 117 for making electrical contact with wires or connecting pins 118 for transferring the sensor signals to the signal processing system. FIG. 15A shows the underside of an embodiment of the flex print connector 110 showing the conductive tracks 114a-114c, alongside a topside view of a set of contact pads 50 to which the conductive tracks would connect. FIG. 15B shows a side view of the flex print connector 110 when connected to the contact pads. The flex print connector is flexible and may be used with any of the sensor embodiments described herein. The maximum bending radius of the flex print connector should be considered, particularly for very small conductive track widths, and alignment between the flex print connector and sensor contact pads during assembly is important.

When the insulating layer 34 is made from a suitable material, such as a polymer insulating film or similar, the flexible membrane 111 may be formed of the same material and integral to the insulating layer 34 as an extension thereof. In this embodiment the conductive tracks 114a-c may be similarly formed of the same material and integral to the sensing electrode 31 and side guard electrode 32 and/or back electrode 35 as an extension of the electrodes. In this configuration, contact pads between the electrodes and conductive tracks will not be necessary, but contact pads may be used at the ends of the conductive tracks. In another embodiment the conductive tracks may be layered in the same way as the electrodes of the sensor, e.g. so that conductive track connected to a back guard electrode is formed over an insulating layer which is formed over the conductive track connected to a sensing electrode, This structure can also be extended to include a conductive track connected to a shield electrode formed over an insulating layer which is formed over the conductive track connected to the back guard electrode, as shown e.g. in FIG. 21D.

Figure 16A:
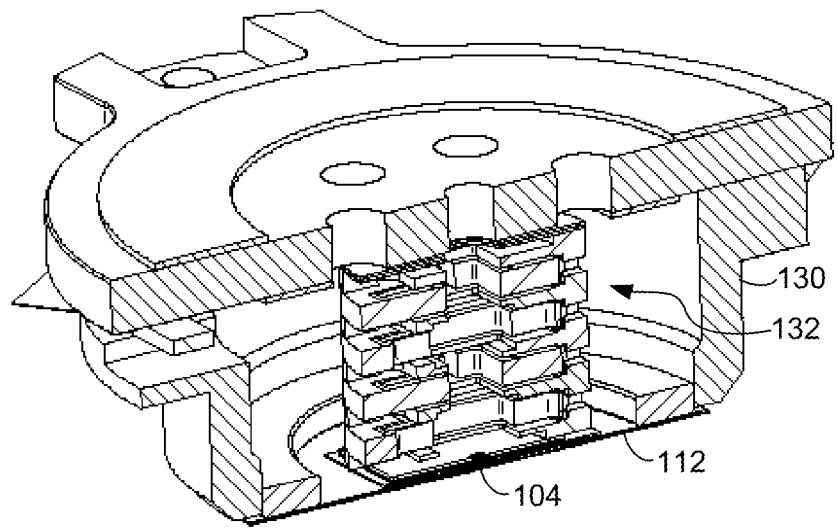
FIGS. 16A and 16B are cross sectional views of a projection lens stack of a charged particle lithography machine.

FIG. 16A shows a cross section through a projection lens and deflector stack 132 of a charged particle lithography machine. The stack 132 typically comprises vertically stacked projection lens elements and beamlet deflector elements for focusing charged particle beamlets generated by the lithography machine onto the surface of the wafer and deflecting them across the surface of the wafer in a scanning pattern. Each vertically stacked projection lens element may actually comprise an array of projection lenses for simultaneously focusing a large number of beamlets onto the wafer surface, each beamlet for exposing a different portion of the wafer, and each deflector element may similarly comprise an array of deflectors.

The lens stack 132 is mounted in a housing frame member 130. A mounting plate 112, which may also function as a spacer between two electrostatic lens elements of the lens stack, is positioned below and affixed to the frame member 130, with a centrally located hole through which the charged particle beam is projected. The plate/spacer 112 may be made from glass or other suitable insulating material to provide an insulating layer between the high voltages present in the lens stack 132 and the bottom lens 104, wafer, sensors, and other components nearby. The plate 112, together with generally cylindrically shaped frame member 130 and upper mounting plate 133, forms a housing structure for the projection lens and deflector stack 132.

The plate 112 may alternatively be conducting or include a conducting layer which functions as a shield electrode for the capacitive sensors. The plate 112 may also be the substrate 102 on which the sensors may be formed. In the embodiment shown, the projection lens stack 132 comprises a series of projection lens elements arranged in a vertical stack, located mostly above the plate 112 but with the final lens element 104 of the stack located below the plate on the bottom surface of the plate 112.

Figure 16B:
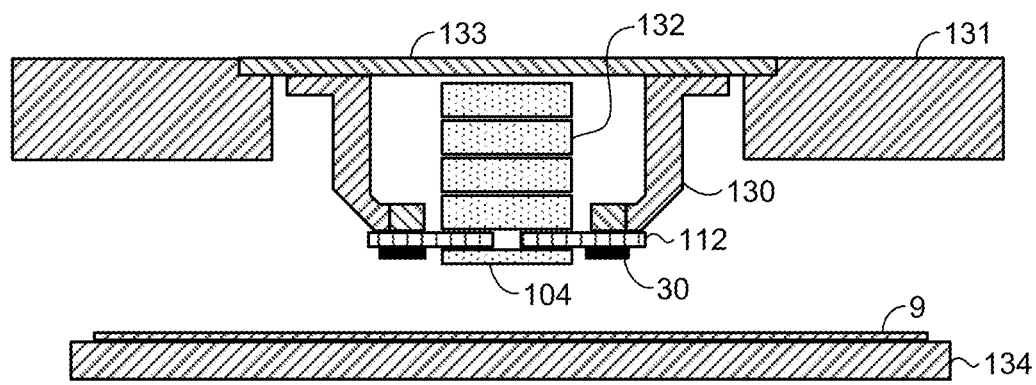

FIG. 16B shows an arrangement of sensors for measuring a distance related to the distance between the bottom projection lens 104 of the projection lens stack and the wafer 9 resting on moveable wafer table 134. Note that the wafer and table are shown schematically for convenience, the width thereof actually being much larger than that of the lens stack housing. Typically the wafer is 200 or 300 mm in diameter versus 50-70 mm for the lens stack housing. The sensors 30 are mounted on the same plate 112 as the bottom projection lens 104, and in close proximity to the lens 104. The sensors are preferably smaller than the size of the exposure field of the lithography machine, and some or all of the sensors may be located closer to the edge of the projection lens than a distance equal to the width or length of the exposure field size.

In this arrangement the sensors are mounted in a fixed relationship to the projection lens, so that the distance between the bottom projection lens 104 and the wafer 9 can be determined from the measured distance between the sensors and the wafer. The very small size of the sensors described herein makes it possible to mount the sensors in close proximity to the projection lens and permits them to be mounted on the same support element as the final focusing element of the projection lens, so they are both fixed to the same reference point. Because the sensors are integrated with the bottom projection lens on a single structure, this greatly reduces errors due to changes in the relative positions of the sensors and the projection lens, caused for example by thermal expansion and contraction and movement between the support element on which the bottom projection lens is mounted and the support element on which the sensors are mounted, and due to mounting imprecision of different base structures for the sensors and bottom projection lens respectively. This results in eliminating the need for calibration of the sensor system for variation in the x and y axis (i.e. parallel to the surface of the wafer) and in the z axis (i.e. perpendicular to the surface of the wafer), or at least reducing the need for such calibration. Conventional capacitive sensors are too tall and wide to mount on the plate 112, and would have to be mounted further away from the projection lens 104, for example on the frame member 131.

The focusing effect is determined principally by the final (bottom) projection lens 104. In the above described integrated design features the capacitive height sensors integrated with the projection lens, so that there are no other elements in between the sensors and the focus generating area of the final projection lens element. The only significant variation in the integrated system is the tolerance of the single projection lens electrode 104, which is a very thin element (typically 200 µm or less). The relation between the sensor and projection lens is only disturbed by the tolerance of the last element 104. The absolute measure of the capacitive sensors will essentially match the distance from the focusing element to the surface of the wafer, i.e. the plane/location where the beams are in focus, except for the thickness tolerance of the focusing element (the last element of the projection lens). This thickness uncertainty of the focusing element is only a small part of the required measurement and operation range of the sensors, thus requiring no additional calibration of the sensor, except for an 'infinity measurement' to determine the rest capacitance of the sensors. This may be determined by simply measuring into infinity, i.e. without a wafer in place. Closely integrating the sensors and the projection lens minimizes the total tolerance of the system so that the reading of the capacitive sensors is sufficient accurate to be used in the lithography machine without additional calibration. An additional advantage is that the minimal design enables measurement of distance to the target (wafer) close to the exposure beams, further minimizing the measurement error.

The sensors are disposed on plate 112 adjacent to the bottom of the projection lens 104. For sensors constructed separately, e.g. according to a thin film construction of the type shown in FIGS. 5-9, the individual sensors may be fixed directly to the mounting plate 112, e.g. with adhesive. For sensors formed on a common substrate, e.g. of the type shown in FIGS. 13A-13D, the sensor substrate may be fixed to the mounting plate 112, also using adhesive or other attachment means. It is also possible for the common sensor substrate to also function as the mounting plate 112.

The bottom of the projection lens 104 may be substantially at the same height as the bottom surface of the sensing electrodes of the sensors 30, or may be slightly lower. By designing the system so that the distance that is desired to be measured is nearly equal to the distance actually measured (i.e. the distance between the bottom surface of the sensing electrodes and the target being measured) the sensitivity of the system is increased. In one embodiment, when used for a lithography machine, the bottom of the projection lens 104 extends 50 µm below the bottom surface of the sensing electrodes of the sensors 30. The focal plane of the projection is 50 µm below the bottom of the projection lens and 100 µm below the sensing electrodes. The wafer table has a z-axis (vertical) movement range of 80-180 µm below the bottom surface of the sensing electrodes, with a positioning accuracy of 100 nm, the top of this range bringing the wafer within 80 µm of the sensing electrodes and the bottom of this range moving the wafer to 180 µm below the sensing electrodes.

FIGS. 17A to 17D show a flexible printed circuit structure 120 with multiple sensors 30 and integrated flex print connector 110. The structure 120 comprises a flexible base of insulating material such as a Kapton polyimide film or similar flexible insulating film. The conductive electrodes for the sensors and conductive tracks for making the connecting lines are formed of a thin layer of copper or other suitable conductive material, fixed to the insulating base layer using adhesive, formed as an adhesiveless laminate, e.g. using a direct metallization process, or printed onto the insulating layer using conductive inks or other suitable printing techniques. A protective insulating film may then be formed over the conductive layers.

Figure 17A:
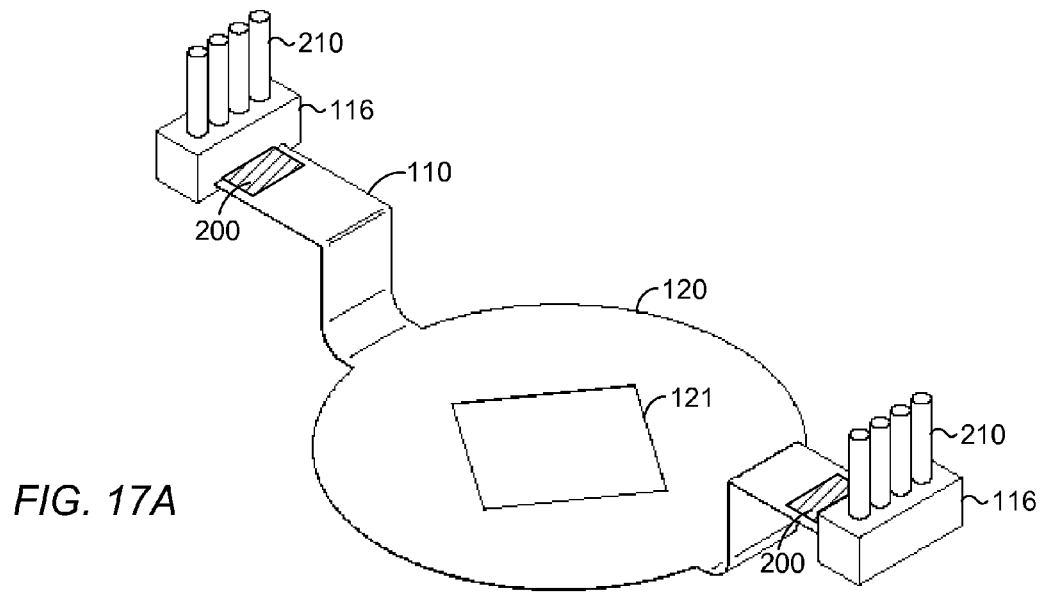
FIGS. 17A to 17D are diagrams of a flexible printed circuit structure with multiple sensors and integrated flex print connectors.
Figure 17B:
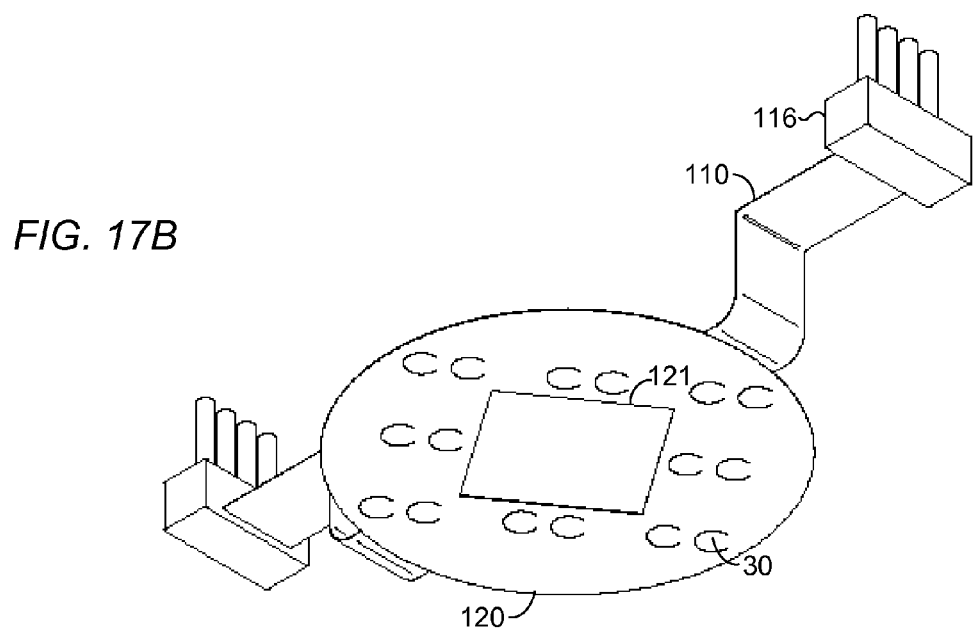
Figure 17C:
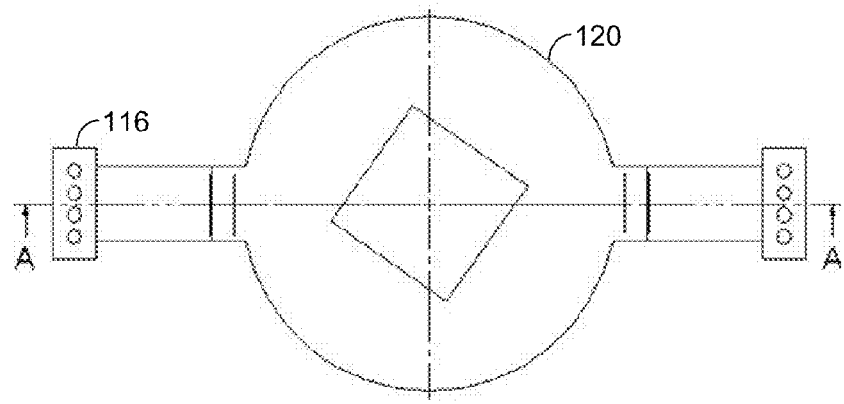
Figure 17D:
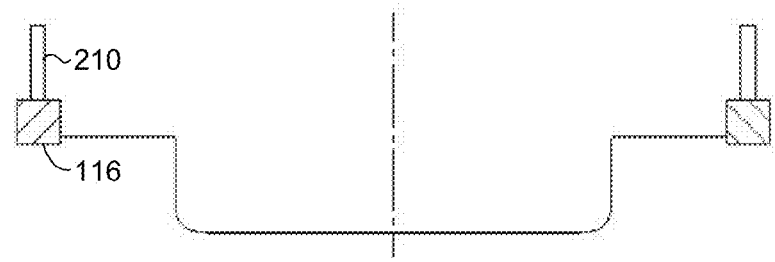

In the embodiment shown in FIG. 17B, eight pairs of sensors are arranged in a square array around a square cutout 121 for accommodating the bottom projection lens 104. Single sensors may also be used in place of the sensor pairs, and different spatial arrangements of the sensors or sensor pairs may also be used. The flexible base layer includes extended portions which function as flex print connectors 110, constructed as described above, for making electrical connections between the sensors and a signal processing system. The flex print connectors 110 connect to connectors 116, which provide stress relief and interface to triaxial cables 210 for connecting to a remote signal processing system.

The integration of a sensor and the connections and wiring necessary to transfer signals from the sensor to a location away from the sensor where a larger and more robust connection can be made solves several problems. The extremely small size of the sensor makes it difficult to make electrical connections due to size limitations of the wiring and connector hardware. The capacitances introduced by wiring must be controlled so that they do not dominate the sensor system. Any small movement or vibration of wiring may result in damage or a need to recalibrate the sensor. The integration of both sensor and sensor wiring onto a single flex print flexible base layer enables a connection at the sensor with very small dimensions, the capacitances introduced by the wiring can be controlled during the design of the system, and the integration onto a single base layer produces a mechanically robust design greatly reducing problems with movement of wiring.

The integration of multiple sensors with their associated wiring onto a single base layer provides additional advantages. By forming the array of sensors on a single base, the spatial arrangement of the sensors is fixed when manufactured, and a larger integrated structure makes for easier handling and affixing to the equipment, e.g. a lithography machine.

Signal preprocessing circuits 200 may be integrated on the flex print connector by printing or otherwise forming the circuits onto the flexible base layer. The signal preprocessing circuits 200 may include a buffer/amplifier used for active biasing of the sensor guard electrodes (described below), may include additional circuitry, or may be omitted so that only connection hardware local to the projection lens and all active components are located remotely. As the lithography machine operates in a vacuum environment, placing active components close to the sensors and in the vacuum may result in problems dissipating heat from the active components due to lack of heat transfer in a vacuum. However, locating the components needed for active guarding close to the guard electrodes increases performance of the system. In the embodiment shown, the signal preprocessing circuits 200 are located next to the connectors 116 so that heat generated by the circuits may be more effectively conducted through the connectors 116 to the cables 210 and away from the sensor arrangement.

Figure 18:
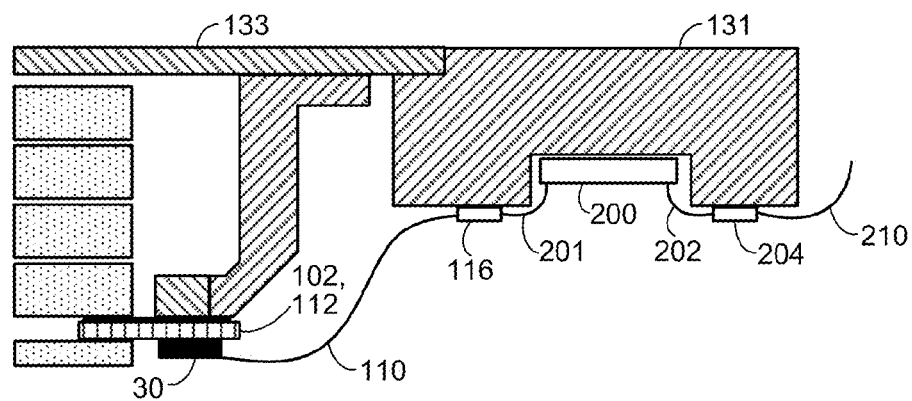
FIG. 18 is another connection arrangement of sensors on a lithography machine.

FIG. 18 shows an alternative connection arrangement. A flex print connector 110 connects at one end to a sensor 30 on mounting plate 112 and at the other end to a signal preprocessing circuit 200 via connecting wires or pins 201. The signal preprocessing unit 200 may be mounted on a frame member 131, preferably in a recess or compartment. The output of the signal preprocessing circuits 200 is transmitted to a control system via wires or pins 202, connector 204, and triaxial cable 210.

Figure 19A:
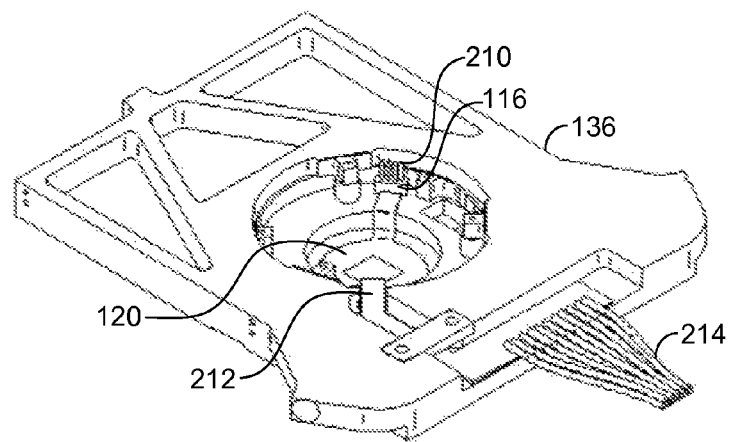
FIGS. 19A and 19B are diagrams of an arrangement for mounting an integrated flexible printed circuit structure on a lithography machine.
Figure 19B:
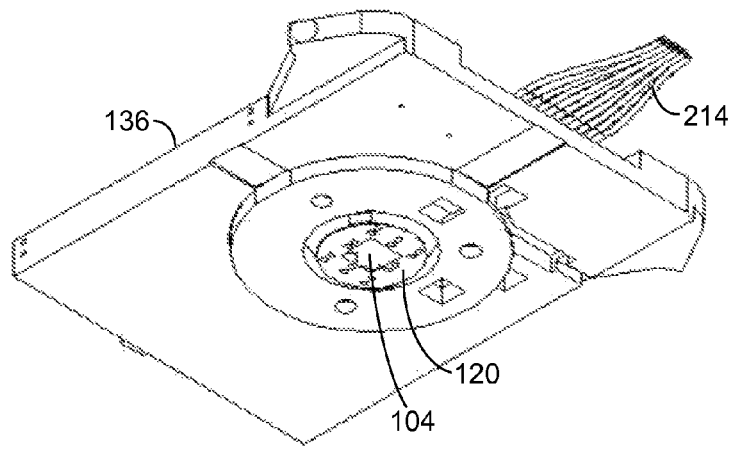

FIGS. 19A and 19B show an arrangement for mounting the integrated flexible printed circuit structure 120 (shown in FIGS. 17A to 17D) in a lithography machine. FIG. 19A shows the arrangement from above, with the projection lens stack removed to improve visibility, and the flexible printed circuit structure 120 located in a well in frame member 136. The connectors 116 connect via triaxial cables 210 to cabling bundle 212 which connects in turn to cables 214 for connecting to a remote signal processing system. FIG. 19B shows a bottom view showing the flexible printed circuit structure 120 and sensors 30 facing towards the wafer.

The flexible printed circuit structure 120 may be fixed to the bottom surface of a mounting plate, e.g. the mounting plate 112 shown in FIGS. 16A and 16B, using an adhesive or other suitable attachment method. This results in the integration of the sensor array with associated wiring with the mounting plate 112 and bottom projection lens 104, all in a single structure. The sensors are thereby mounted in close proximity to the projection lens and in a fixed relationship to the projection lens, resulting in the benefits as described above for the embodiment in FIGS. 16A and 16B.

Figure 20A:
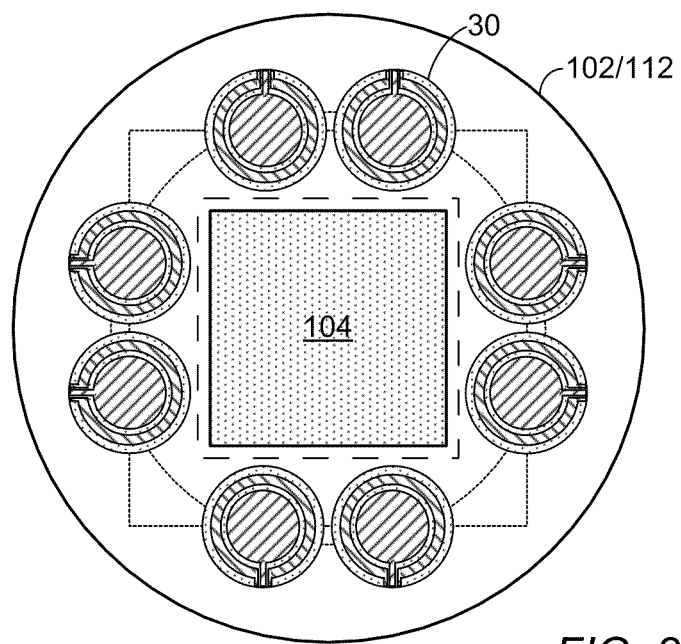
FIGS. 20A and 20B are diagrams of configurations of capacitive sensors on a mounting plate.
Figure 20B:
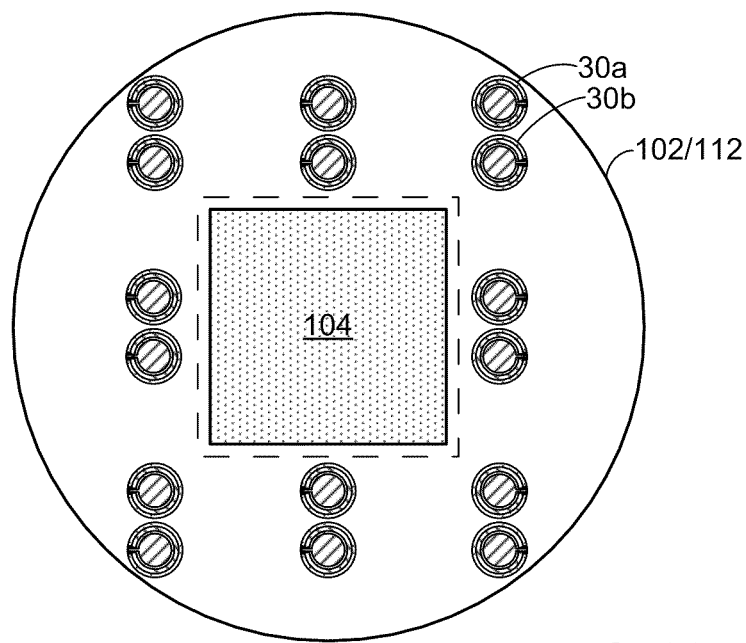
Figure 20C:
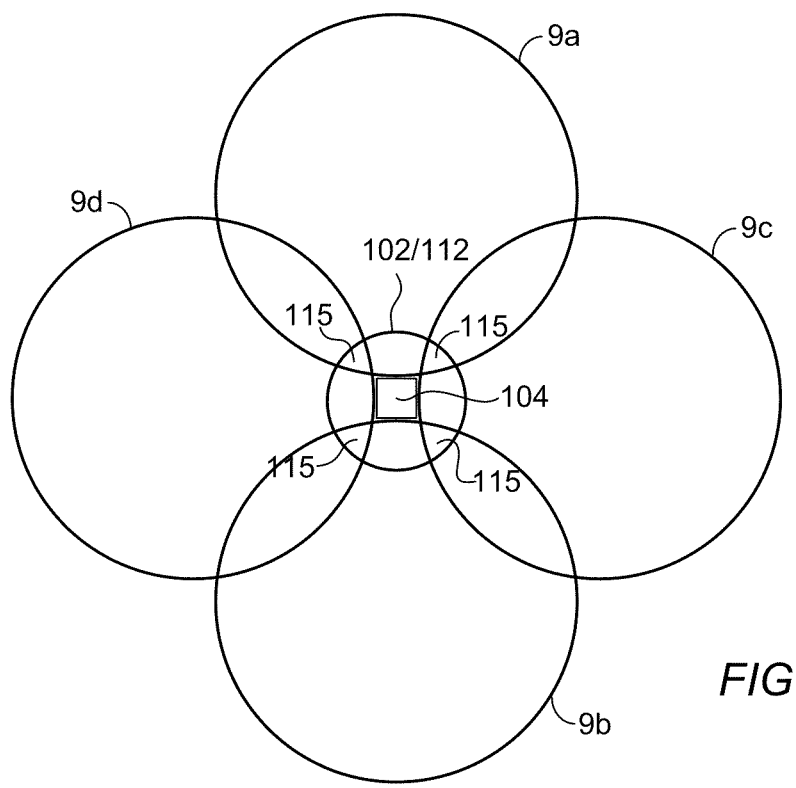
FIGS. 20C and 20D are diagrams of capacitive sensors arranged in diagonal configuration.
Figure 20D:
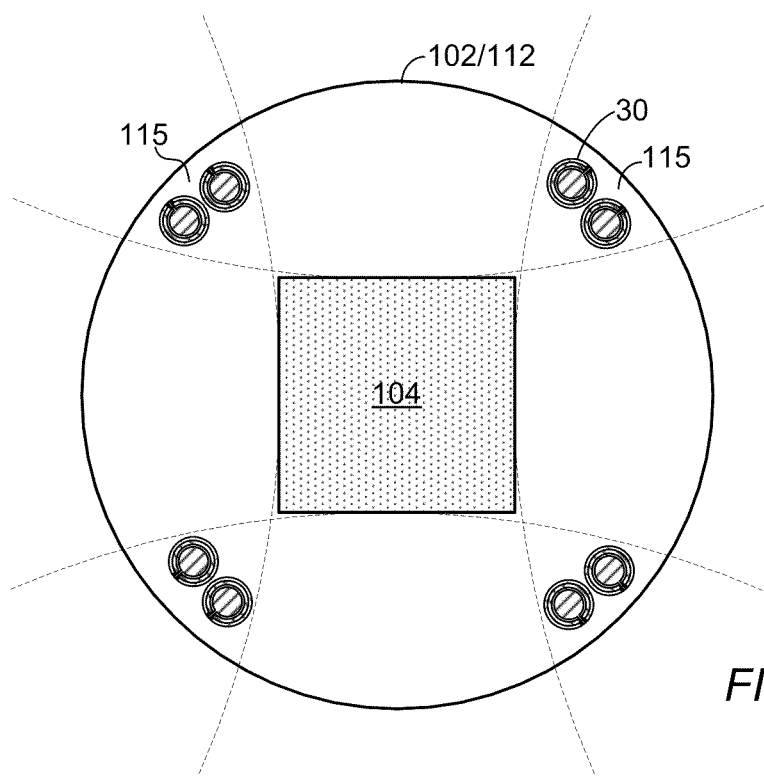

FIGS. 20A, 20B and 20D show various configurations of capacitive sensors on a mounting plate 112 surrounding a lithography machine projection lens 104. In FIG. 20A, four sensor pairs are distributed in the four quadrants of the mounting plate 112, the sensors arranged in pairs for differential sensing. On the bottom side of the mounting plate, each sensor comprises a sensing electrode 31 and may also include a side guard electrode 32. This arrangement is particularly suited to measurement of height and tilt of a wafer. FIG. 20B shows an arrangement of sixteen sensors arranged in pairs in a square matrix, the middle of the square having no sensors where the projection lens 104 is located. For all of the configurations described above, back guard electrodes are preferably included on the back side of a sensor substrate, and shield electrodes may also be included as described above. FIG. 20C shows wafers 9a, b, c, d in various positions in relation to the mounting plate 112 and the sensors, the areas of overlap between the four wafer positions describing four areas 115 on the plate 112 extending from the four corners of the projection lens 104. FIG. 20D shows four sensor (differential) pairs arranged in these four areas 115.

This arrangement of the areas 115 distributes the sensors to maximize the possibility to measure distance to the wafer surface with at least one sensor or sensor pair. If the wafer is positioned so that only one sensor/pair is located above the wafer, then the distance measurement to the wafer surface is based on this sensor/pair alone. As soon as another sensor/pair becomes positioned above the wafer, a measurement will also be taken from this sensor/pair, and an average distance value can be calculated from the two sensors/pairs above the wafer. Similarly, a third and fourth sensor/pair will be taken into account when they become positioned over the wafer. The inclusion of additional sensors/pairs are preferably included in the calculation of an average distance by fading in, e.g. by gradually including the contribution of the further sensors/pairs in order to avoid sudden steps in the final measured distance value.

The size of the mounting plate 112 determines the minimum target size, typically about 60 mm. For 300 mm wafers, the four overlapping areas 115 between wafer positions 9a-9d indicate suitable disposition areas for the sensors. However, the sensors are preferably mounted as closely as possible to the actual projection area of the light or electrode beams of the lithography machine. Larger wafer sizes such as 450 mm tend to enlarge the areas 115, because the circular sections defining the areas 115 tend towards straight lines.

Figure 21A:
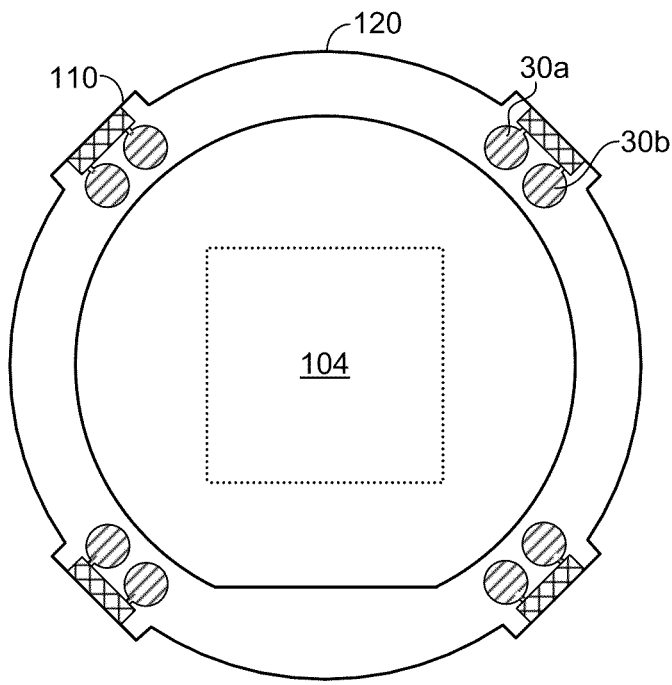
FIGS. 21A and 21B are diagrams of a thin film structure with multiple capacitive sensors formed on it.
Figure 21B:
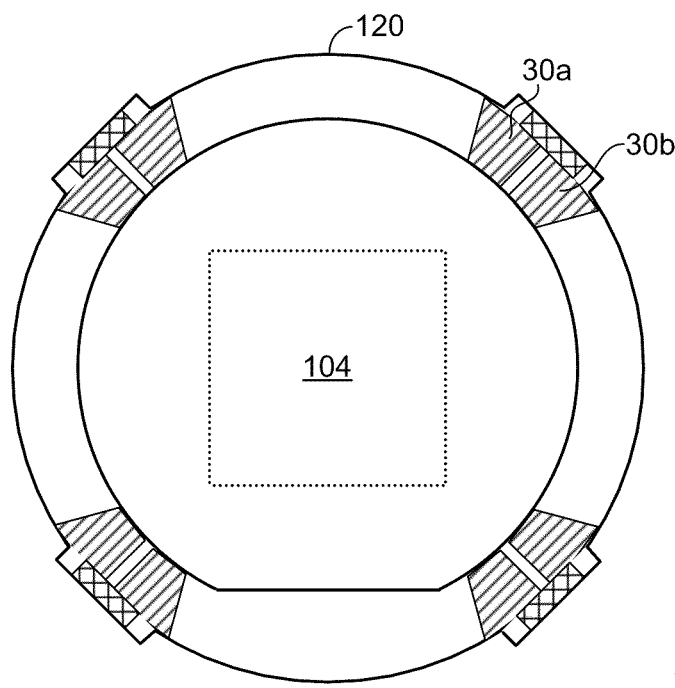

FIGS. 21A and 21B show an embodiment of a flexible printed circuit structure 120 with four differential sensor pairs 30a, 30b. The structure 120 may be formed of a flexible base of insulating material such as a Kapton polyimide film or similar flexible insulating film similarly to the embodiment of FIGS. 17A-17D and may also include one or more integrated flex print connectors 110. In the embodiments shown, seen from below facing the sensing electrodes (and omitting any insulating protective layer over the sensors so that the sensing electrodes can be seen) the four sensor pairs are arranged for positioning in the areas 115 of FIG. 20D around a bottom projection lens 104. Single sensors may also be used in place of the sensor pairs. The integration of the sensors and the wiring connections enables simple and robust connections to be made to the very small sensors and control of capacitances introduced by the wiring. FIG. 21A illustrates an embodiment with circular sensors. FIG. 21B illustrates an embodiment with quadrilateral shaped sensors to maximize use of the area 115 (the sensors are shown with sharp corners for simplicity, although rounded corners are preferred as shown e.g. in FIG. 9D).

Figure 21C:
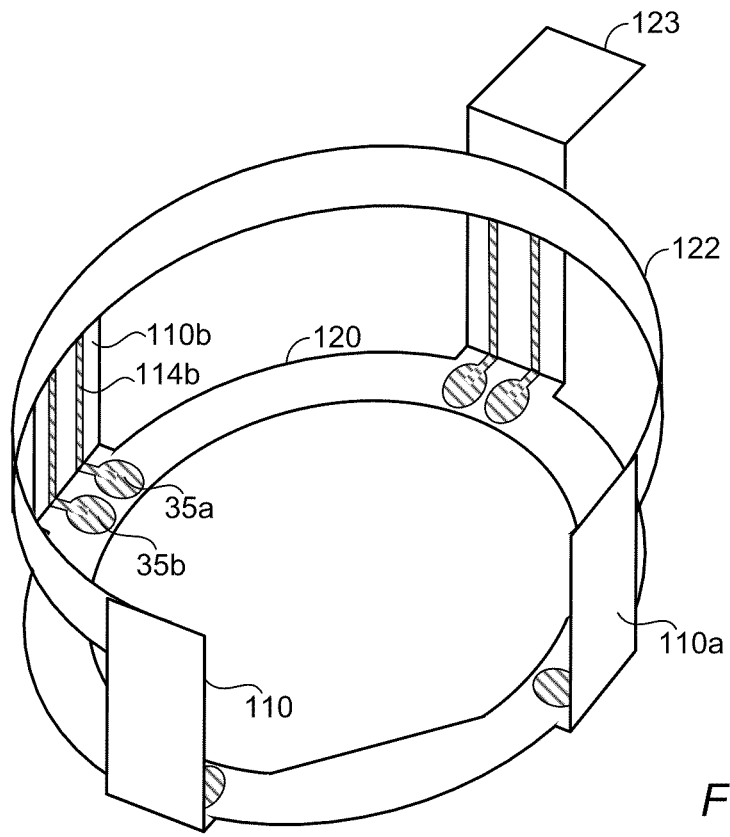
FIG. 21C is a diagram of a flexible printed circuit structure with multiple sensors and integrated flex print connectors.

FIG. 21C shows the flexible printed circuit structure 120 at an angle from behind the sensors. Four integrated flex connectors 110 are folded and extend upwards from the base layer 120. Conductive tracks extend from the sensor electrodes of each sensor along the flex connectors 110, and then around the flexible membranes 122 and 123 for connection to cables for connecting to remote circuitry. The base layer is seen from above and the back guard electrodes 35a, 35b of the sensors are shown (the insulating layers and any shield electrodes are omitted so that the back guard electrodes can be seen) with conductive tracks 114b formed on an inner side 110b of the flex connectors 110. Conductive tracks may also be formed on the outer side 110a of the flex connectors 110. The conductive tracks may be formed of a thin layer of copper or other suitable conductive material, fixed to the insulating layer using adhesive, formed as an adhesiveless laminate, or printed onto the insulating layer as in the embodiment of FIGS. 17A-17D.

Figure 21D:
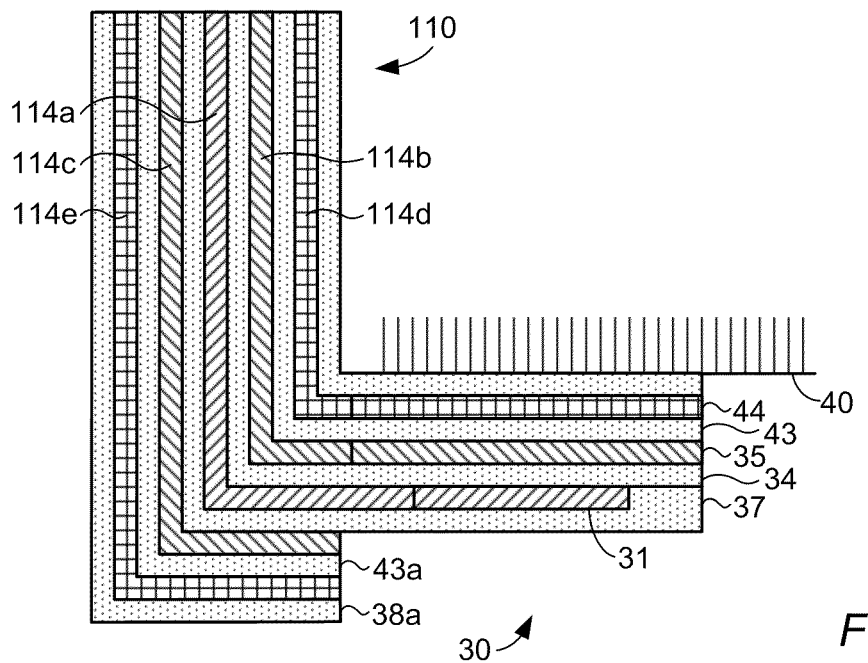
FIG. 21D is a cross sectional view of an integrated flex print connector.

FIG. 21D is a cross sectional view of a sensor 30 and associated flex connector 110. Conductive tracks 114a-e extend from the sensor electrodes along the flex connector 110 for connecting the sensor to remote circuitry. In this embodiment, the conductive tracks 114a-e are formed of the same material and integral to the sensor electrodes, as an extension of the electrodes. The conductive tracks are arranged in layers in the same way as the electrodes of the sensor. Insulating layer 34 includes an extended portion for the flex connector 110. Conductive track 114a extends from sensing electrode 31, both formed on insulating layer 34. Conductive track 114b extends from back guard electrode 35, both formed between insulating layers 34 and 43, with conductive track 114b being wider than conductive track 114a so that conductive track 114b has a peripheral portion which functions as a side guard electrode for the conductive track 114a. Conductive track 114a carries the signal from the sensing electrode and will have a certain capacitance to conductors in the surrounding environment. Conductors near to the conductive track 114a will influence this capacitance, in the same way as they influence the sensing electrode of the sensor. The conductive track 114b is thus designed to act as a side guard electrode to reduce disturbances due to nearby conductors.

Where the sensor includes a shield electrode, conductive track 114d extends from shield electrode 44, both formed between insulating layers 43 and 38. This arrangement extends the effect of the shield electrode over the length of the conductive track 114a which carries the measurement signal from the sensing electrode, to reduce disturbances to the distance measurement and outside influences.

In the embodiment of FIG. 21C, the conductive tracks 114b and 114d and intervening insulating layers extend inwards on the inner surface 110b of the flex connectors. A similar arrangement may be duplicated on the outer surface 110a of the flex connectors. An insulating protective layer 37 may be formed and extended along the flex connector 110 over the conductive track 114a, with conductive track 114c extending along the flex connector above the conductive track 114a with peripheral portions extending on either side of it. The conductive track 114c can then be electrically connected to conductive track 114b which is connected to the back guard electrode, thus bringing conductive track 114c to the same potential as the back guard electrode. Conductive track 114c could also be directly connected to the back guard electrode or electrically connected by some other means.

Similarly, another insulating layer 43a may be formed extending along the flex connector over the conductive track 114c, with another conductive track 114e extending along the flex connector above the conductive track 114c. The conductive track 114e can be electrically connected to conductive track 114d or to a cable conductor for connection to a ground potential, preferably a ground remote from the sensor. Lastly, a protective layer 38a may be formed over the top.

With this two-sided arrangement the conductive track 114a carrying the signal from the sensing electrode is effectively sandwiched between extensions of the back guard electrode, and this combined structure is sandwiched between extensions of the shield electrode, thus greatly reducing disturbances to the distance measurement and outside influences.

The conductive tracks 114a-e may be connected at the ends remote from the sensors to a cable for sending the sensor signals to remote circuitry. A triaxial cable may be used, the center cable conductor connected to conductive track 114a, the middle cable conductor connected to conductive tracks 114b and 114c, and the outer cable conductor connected to conductive tracks 114d and 114e. These connections can be made by exposing contact pads of the metal of each conductive track through holes in the overlying insulating layers.

The sensor and connector structure shown in FIG. 21C is suitable for mounting and connection of an array of capacitive sensors to a projection lens of a lithography machine. This arrangement achieves several goals, providing a flexible base layer for mounting very small thin film capacitive sensors directly to the same mounting plate onto which the last projection lens element is mounted and in close proximity to the focus point of the projection lens. This method of mounting removes the need for calibrating the sensor system due to variations in the height between the sensing elements and the projection lens. The integral connectors extending from the sensor electrodes create robust electrical connections to the sensor which introduce minimal variations in the capacitance of the system, removing the need for calibration due to variances in the connections to the sensor.

This results in a very simple system which requires no in-situ calibration. The rest capacitance of the sensors can be determined (which may be simply performed by measuring into infinity, i.e. without a wafer in front of the sensor) and subsequently offset. No further calibration of the sensors is required since the rest capacitance of the sensors is essentially fixed. Parasitic capacitances (e.g. due to small movements of wiring) are easily maintained low since movement or vibration of the connections is largely removed by the fixed connecting structure and triaxial cable. The resulting structure is easily affixed within the lithography machine and facilitates removal and replacement of the sensors or the combined projection lens plus sensor structure without lengthy recalibration.

Electronic Circuits

Figure 22:
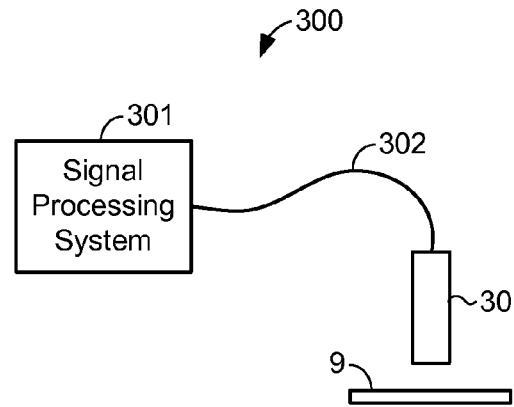
FIG. 22 is a schematic diagram of a sensor system and signal processing system.

FIG. 22 shows a sensor system 300 comprising one or more sensor probes 30, a signal processing system 301, and a connection system 302 for conveying signals from the sensor probes to the signal processing system. The signal processing system 301 may include current or voltage source circuitry for driving the sensor probes, amplifier/buffer circuitry for amplifying the raw sensor signal, circuitry for biasing the sensor guard electrodes and connecting cable conductors, signal processing circuitry for processing the signals received from the probes and for output of the processed signals as measurement data, and circuitry for calibrating the system. The connection system 302 my include cables to connect the sensors to the signal processing system.

Each part of the system may be a source for various types of measurement errors and factors reducing sensitivity. Errors are introduced by the sensor probes due to the finite geometry of the probes and the limitations of the manufacturing process resulting in irregularities and imprecision in the geometry of the sensor electrodes and other components. Intrinsic/parasitic capacitances, due to the structure of the sensor probe, and interaction with other components near to the probes, may reduce sensitivity of the sensors.

Errors may be introduced by the mounting of the probes, as a result of tilt or non-flatness of the mounting surface or probes, and tolerances in the position and other factors relating to the mounting. Errors may be introduced by the signal processing system, due to signal processing errors, component tolerances, external or internal interference, and other factors. Errors may also be introduced by the connection system, such as additional capacitances introduced by the connecting components such as connecting lines, contact pads, connection wires and cabling.

Figure 23A:
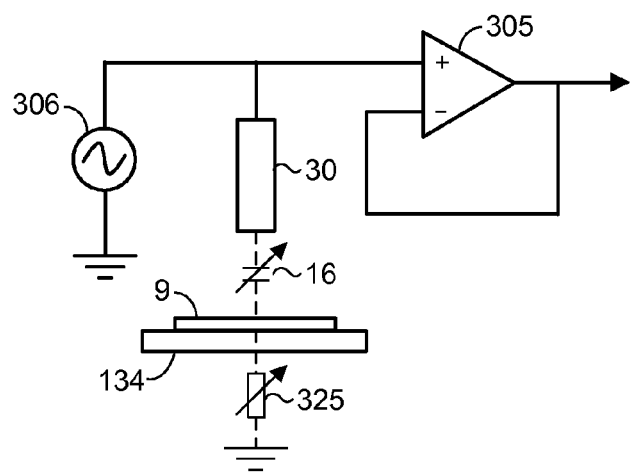
FIG. 23A is a simplified circuit diagram of a high-impedance amplifier circuit with current source.

To detect a change in the capacitance of the sensors, which represents distance between the sensor and the target, various amplifier configurations can be used. FIG. 23A is a simplified circuit diagram of a basic high-impedance amplifier circuit. The high input impedance amplifier uses a unity gain non-inverting configuration of an amplifier 305. An AC current source 306 is connected as an input to the amplifier, in parallel with the sensor probe 30. The circuit produces a linear output 309 proportional to the change in capacitance, which varies with the distance between the sensor probe 30 and target 9.

The sensor 30 is connected between the input of the amplifier and ground or virtual ground, i.e. one electrode of the capacitance being measured is connected to ground. However, for distance measurements to a wafer, the sensing electrode of the sensor forms one electrode of the measured capacitance while a conducting layer in the wafer forms the other electrode. The conducting layer of wafer 9 is typically capacitively coupled to ground via the wafer table 134 and other lithography machine components. The capacitance between the wafer and ground typically varies between 6 pF to 70 nF, and the nominal value of the sensor capacitance is typically about 0.1 pF to 1 pF. To measure the small changes in distance between the sensor 30 and wafer 9 accurately it is necessary to have the wafer to ground capacitance at least 1000 times larger than the nominal capacitance of the sensor. Since the range of variation of the wafer to ground capacitance is quite large, small changes in this capacitance can affect the distance measurement. If the wafer to ground capacitance is not at least 1000 times larger than the nominal capacitance of the sensor, then small changes in wafer to ground capacitance will cause changes in the measured capacitance and unwanted changes in the distance measurement.

Figure 23B:
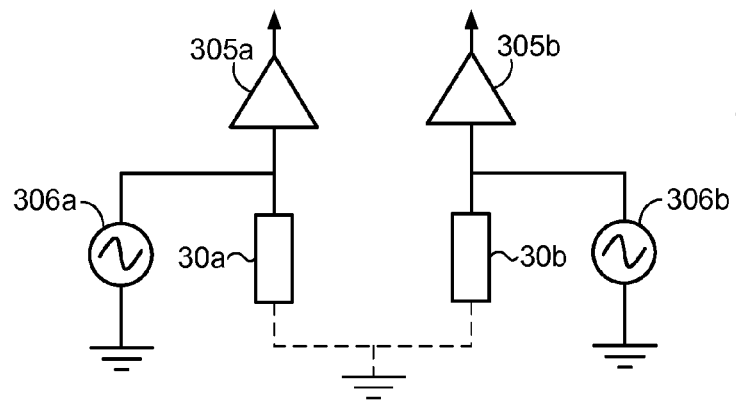
FIG. 23B is a simplified circuit diagram of a differential sensor arrangement with current source.

In the differential measurement principle the two sensors 30a, 30b of a differential pair are driven by current sources 306a, 306b which are 180 degrees out of phase, as shown in FIG. 23B. The current through one probe finds a path through the conductive layer in the target. A virtual ground, i.e. the lowest potential or a constant potential in the current path is created at the centre of the current path. High impedance amplifiers 305a, 305b are used to measure the voltage signals corresponding to the change in the distance between the sensors and a conductive layer in the target. The differential measurement principle makes the distance measurement independent of the variation in the wafer to ground impedance.

Figure 24A:
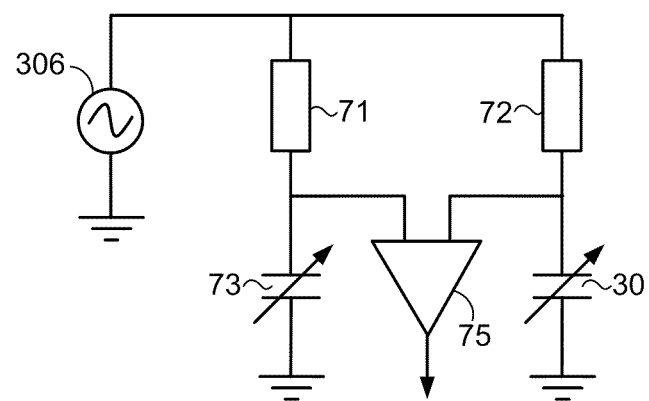
FIG. 24A is a simplified circuit diagram of a whetstone bridge arrangement with voltage source.

FIG. 24A shows an alternative circuit for biasing the sensor 30 with a voltage source. Two fixed impedances 71 and 72, a variable capacitance 73, and the sensor 30 (shown as a variable capacitance) are arranged in a whetstone bridge arrangement energized by voltage source 306. The bridge has two legs in arranged in a parallel circuit, the impedance 71 and variable capacitance 73 connected together at a first node and forming one leg, and the impedance 72 and the sensor 30 connected at a second node and forming the other leg. The fixed impedances 71 and 72 have identical impedance values, and the variable capacitance 73 is adjusted to match the nominal capacitance of the sensor 30. The two nodes at the mid point of each leg of the bridge are connected to the two inputs of a differential amplifier 75, which measures the difference in the voltage across nodes, i.e. across the variable capacitance 73 and sensor 30. The variable capacitance is tuned to adjust the null value of the differential amplifier, and may be adjusted by an automated calibration algorithm.

The bridge components and differential amplifier may be located at the sensor. When used in conjunction a flex print construction as shown in FIGS. 17A-17D, the fixed impedances 71, 72 may be formed on the same flexible base layer as the sensor. The variable capacitance 73 may be formed using a variable capacitance diode (varicap) or other suitable component. The variable capacitance 73 may also be integrated on the flexible base layer, as a component mounted or formed on the base layer, or integrated into the flexible structure itself using copper and insulating layers. The differential amplifier may be formed on the base layer, but the considerations regarding active components in a vacuum environment discussed above also apply. When the differential amplifier is remotely located and the same cable length is used for connection to the sensor and variable capacitance, the effect cable capacitance can be removed and common mode disturbances may be cancelled out.

Figure 24B:
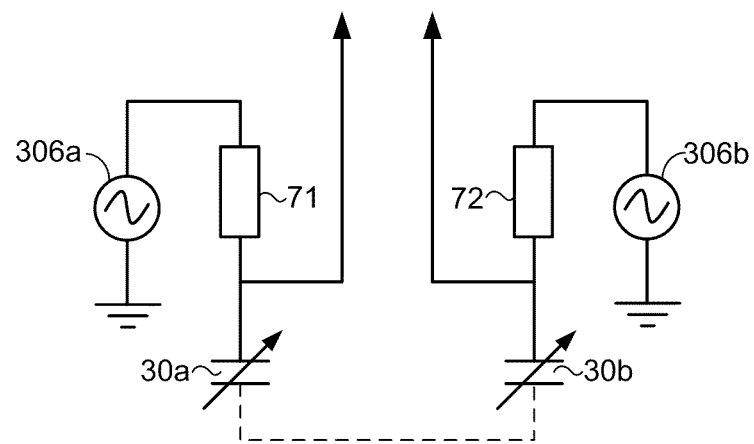
FIG. 24B is a simplified circuit diagram of a differential sensor arrangement with voltage source.

FIG. 24B shows the circuit of FIG. 24A implemented for a differential sensor pair. Each sensor 30a, 30b of the pair is connected to a fixed impedance 71, 72 and biased by a voltage source 306a, 306b. The whetstone bridge arrangement is now formed by the fixed capacitances 71 and 72 and the sensor pair 30a and 30b, which are connected via conductive wafer resist on the target.

Figure 25:
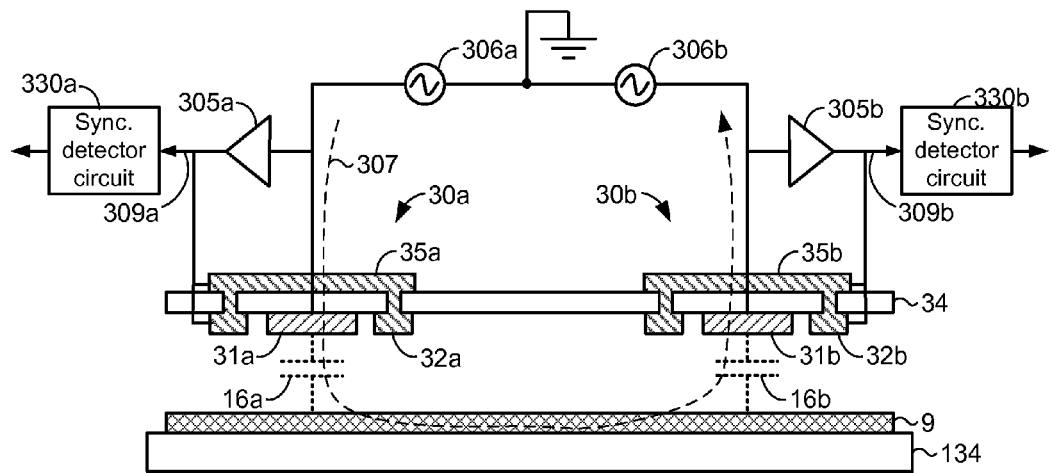
FIG. 25 is a simplified circuit diagram of a differential sensor circuit arrangement.

FIG. 25 shows an embodiment using differential measurement with high impedance amplifier circuits. Two sensors 30a, 30b are arranged in a differential pair. The sensing electrode 31a of sensor 30a is driven by AC current source 306a, and sensing electrode 31b of sensor 30b is driven by AC current source 306b. The two current sources 306a, 306b are 180 degrees out of phase to each other. During one half cycle, current 307 flows in one direction through sensor 30a and sensor-to-target capacitance 16a, through a conductive layer of the target 9, and through sensor-to-target capacitance 16b and through sensor 30b. During the next half cycle the current flows in the reverse direction.

Amplifier/buffer 305a amplifies the raw output voltage of sensor 30a to generate output signal 309a for further processing. The output 309a may also be fed back to the side guard electrode 32a and/or back guard electrode 35a of the sensor 30a. This implements active guarding by energizing the guard electrodes with the same voltage that is present in the sensing electrode, so that there is no electric field formed between the sensing electrode and the guard electrode, so that the electric field between the sensing electrode and the target is as uniform as possible. Amplifier/buffer 305b similarly amplifies the raw output voltage of sensor 30b to generate output signal 309b, and provide an active biasing signal for the guard electrodes 32b, 35b of sensor 30b. The output signals 309a, 309b may be input to synchronous detector circuits 330a, 330b respectively.

The amplifiers 305a, 305b are preferably located close to the sensors 30a, 30b, particularly when active biasing of the guard electrodes is implemented, to prevent the introduction of errors caused by additional capacitances introduced by cabling from the sensors to a remote location where the signal processing takes place. For capacitive sensor applications for a lithography machine operating in a vacuum, placing active components close to the sensors usually requires putting these components in the vacuum chamber, which may result in heat dissipation problems due to lack of heat transfer by radiation in a vacuum (although heat transfer by conduction still occurs in a vacuum). For this reason, the current sources 306a, 306b and further signal processing circuits such as the synchronous detectors 330a, 330b may be located remotely from the sensors outside the vacuum chamber. However, the amplifiers 305a, 305b are preferably located in the vacuum chamber close to the sensors to achieve lower measurement error, in a configuration that permits conduction of heat away from the active components.

Figure 26:
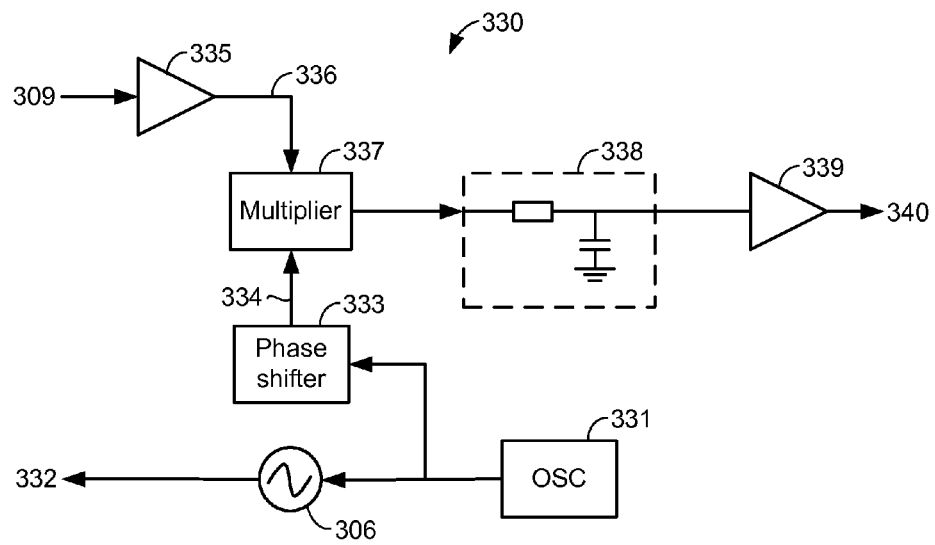
FIG. 26 is a simplified circuit diagram of a synchronous detector circuit.

FIG. 26 shows one embodiment of a synchronous detector circuit 330. A reference oscillator 331 generates a reference frequency f1 which is used by current source 306 to generate alternating current 332 for driving the sensor, and is used by phase shifter 333 to generate reference signal 334 (also at frequency f1) which has a phase shift in relation to the reference frequency. The phase shift of the reference signal 334 is tuned to be equal to the phase shift between the reference frequency and signal 309 from the sensor, to account for phase shift occurring in the cabling between the synchronous detector circuit 330 and sensor and within the sensing arrangement.

The output 309 from the sensor at frequency f2 is the input to input buffer 335. Multiplier 337 receives the buffered or amplified input signal 336 at frequency f2 and reference signal 334 at frequency f1. The output from multiplier 337 will include components of the sum of the two input frequencies (f1+f2) and the difference between the two input frequencies (f1−f2). The output from multiplier 337 is passed through low pass filter 338 to filter out the higher frequencies to leave the low frequency component representing the difference between the two input frequencies (f1−f2). This signal is amplified by amplifier 339 to generate measurement signal 340. This measurement signal 340 represents the change in impedance measured by the sensor, which depends on the change in distance between the sensor and the target.

Figure 27:
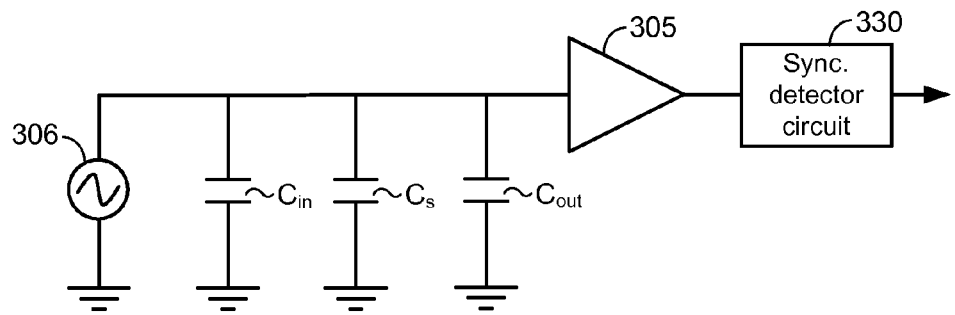
FIG. 27 is a schematic diagram showing capacitances in a sensor system.

As noted above, the current source circuits for driving the sensors and signal processing circuits may be located remotely from the sensors. However, a cabling connection used for connecting the sensors to the remote circuits will introduce additional undesirable capacitances in the system. FIG. 27 is a diagram showing capacitances in the sensor system. Capacitance Cin represents the cable capacitance plus the output capacitance of the current source 306, capacitance Cs represents the sensor-to-target capacitance being measured plus the intrinsic (parasitic) capacitance of the sensor and sensor connecting lines, and capacitance Cout represents the cable capacitance plus the input capacitance of the buffer 305. The stray capacitances Cin and Cout should be small in comparison to Cs and the sensor-to-target capacitance being measured, because large stray capacitances will reduce the sensitivity of the sensor.

Figure 28A:
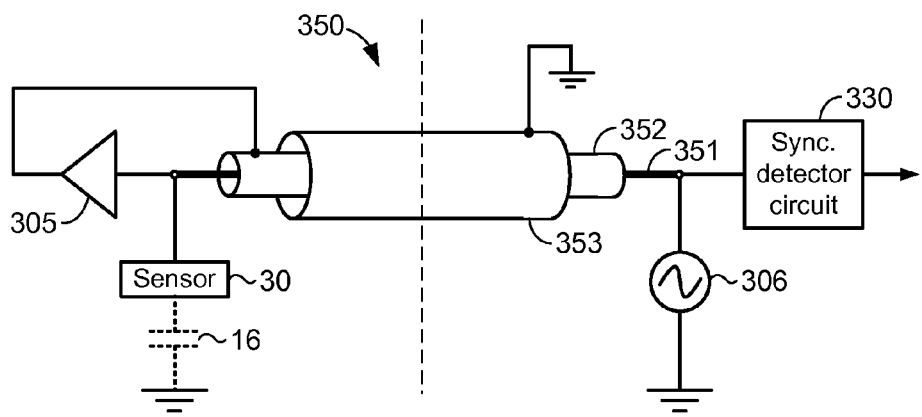
FIGS. 28A and 28B are simplified circuit diagrams of an arrangement with a cable connecting a sensor to a signal processing circuit.

The capacitance of the cable connecting the sensors to the signal processing circuits may be large and have an adverse effect on the sensitivity of the sensor. Active guarding may be used for the cable conductors to reduce or eliminate this problem. FIG. 28A shows an arrangement with a cable 350 connecting sensor 30 to signal processing circuit 330. In the arrangement shown, amplifier/buffer 305 is located locally to the sensor 30 (to the left of the vertical dashed line) and the current source 306 is located remotely from the sensor (to the right of the vertical dashed line). The current source 306 transmits current to the sensor 30 via the center conductor 351 of the cable. The buffer 305 energizes the coaxial conductor 352 with the same voltage as present on the sensor's sensing electrodes. Since the center conductor 351 and coaxial conductor 352 have the same voltage on them, the effect of any stray capacitance between the conductors is effectively nullified.

Figure 28B:
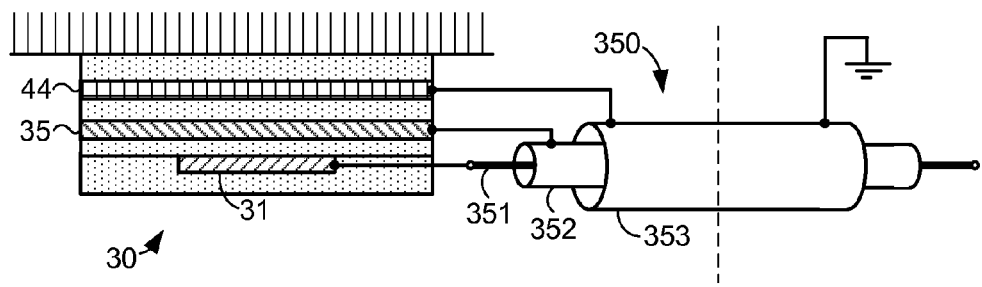

FIG. 28B shows the connections between the conductors of cable 350 and the conductive electrodes of sensor 30. The central conductor 351 is connected to the sensing electrode 31, the inner coaxial conductor 352 is connected to the back guard electrode 35, and the outer coaxial conductor 353 is connected to the shield electrode 44.

The cable in this embodiment is a triaxial cable with a third coaxial conductor 353 which functions as a shield and is grounded. The shield is preferably connected to a separate ground at the remote end of the cable, e.g. at the circuit 330. This ground is just a shielding ground and is preferably not connected to any ground at the sensor.

Many alternatives to this arrangement are possible. For example, a non-coaxial cable can also be used, and the buffer 305 may be located remotely from the sensor to energize the conductor 352 from the far end of the cable 350 locally to the signal processing circuits 330.

The physical separation of sensor and signal processing circuitry has been avoided in conventional designs, in which the sensors and circuitry were supplied together by one manufacturer and calibrated together in the factory as a set to match the electronic circuits to the sensor and avoid non-linearities. In the system described herein, an automated script may be used in conjunction with the wafer table control system to calibrate the sensing system quickly, e.g. by moving the wafer table to known positions and taking measurements from the sensors. This removes the necessity of treating the sensor and signal processing circuitry as a matched pair and allows replacement of a sensor without also replacing the signal processing circuitry, greatly simplifying maintenance and reducing non-productive time for the lithography machine and thus increasing throughput.

Figure 29:
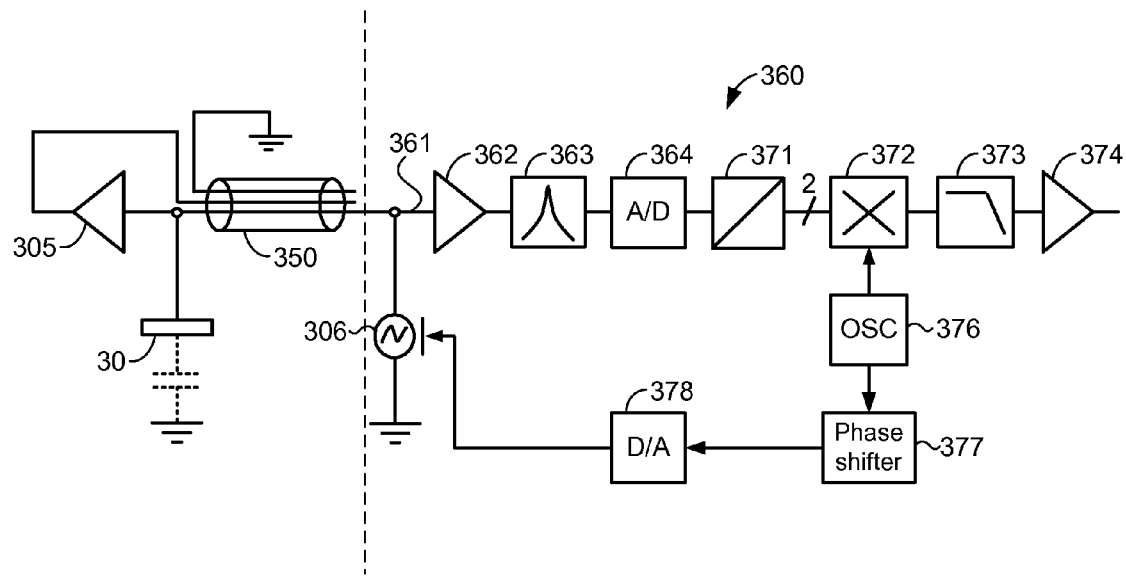
FIG. 29 is a simplified circuit diagram of another embodiment of a synchronous circuit.

FIG. 29 shows another embodiment of a synchronous circuit 360. A digital reference oscillator 376 generates a reference frequency f1, which forms a reference signal input to mixer 372, and is also fed to digital phase shifter 377 to introduce a phase delay. The phase delayed reference frequency is converted to an analog signal by digital-to-analog converter 378, and the analog phase delayed signal drives the current source 306 which energizes the sensor 30. The phase delay is tuned to equal the phase shift occurring in the sensing system and cable 350, equal to the phase difference between the reference frequency f1 and the sensor system output signal 361 at the input to the synchronous detector circuit. The phase delay may be set by adjusting the phase shifter 377 until a maximum output is obtained from the mixer 372. Note that the phase shift in the sensing system and cable should remain constant even when the capacitance of the sensor changes.

Input buffer 362 receives the sensor signal 361, and the buffered signal is input to band pass filter 363 to filter out noise and interference from the signal. The filtered signal is converted to a digital signal by analog-to-digital converter 364. Digital processing is then used, the circuit 360 thus combining analog and digital processing of the signals to use the best features of both. The digital filtered sensor signal is then input to a single-input differential-output, differential amplifier (or phase splitter) 371 with two differential outputs, one in phase with the input signal and the other output 180 degrees out of phase with the input signal. Mixer 372 receives the differential outputs (at frequency f2) and the reference signal (at frequency f1). The input frequencies f1 (the reference frequency) and f2 (the frequency of the sensor signal 361) are eliminated in mixer 372 and the mixer output includes components with frequencies of the sum and difference of the input frequencies (i.e. f1+f2 and f1−f2). The low pass filter 373 filters out the sum of the frequencies leaving the low frequency component representing the difference between the reference frequency and the sensor signal frequency (f1−f2). When the frequencies f1 and f2 are equal and in phase, the mixer outputs a DC value proportional to the amplitude of the sensor signal 361, which is proportional to the sensor capacitance and proportional to the distance between the sensor and the target. Amplifier 374 amplifies the output from the low pass filter and it may then be input to a control system.

A calibration algorithm may be used to automatically calibrate the synchronous detector circuit to the sensor system. The algorithm adjusts the digital phase shifter 377 in steps to increment or decrement the phase delay, and monitors the output of the mixer 372. The phase-shifter is adjusted until a maximum value is achieved at the output of mixer 372, indicating that the reference signal and sensor signal are in phase.

The digital processing of the synchronous detection circuit may be implemented using a field programmable gate array (FPGA), and the calibration algorithm can also be implemented in the FPGA and/or in software working in conjunction with the FPGA.

This design with automated calibration allows for replacing a sensor or array of sensors without the need for also replacing or recalibrating the signal processing circuitry which processes the measurement signals from the sensor or sensors. Conventional sensor system designs involved sensors and signal processing circuitry calibrated together in the factory as a matched set, so that replacing a sensor required also replacing the signal processing circuitry. The automated calibration algorithm enables the sensors to be replaced independently of the signal processing circuits and swift calibration of the new sensors with the existing signal processing circuits, greatly simplifying maintenance and reducing non-productive time for the lithography machine. This enables less downtime and consequently higher throughput of the lithography machine.

Figure 30:
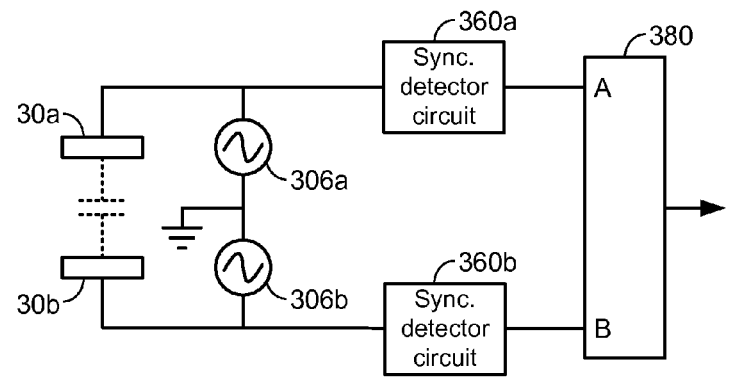
FIG. 30 is a simplified circuit diagram of an arrangement for processing signals from a differential pair of sensors.

FIG. 30 is a simplified diagram of a processing circuit for a differential pair of sensors 30a, 30b. The sensors are biased by current (or voltage) sources 306a, 306b operating 180 degrees out of phase. The output of each sensor 30a, 30b is fed to synchronous detector circuits 360a, 360b respectively, and the outputs of the synchronous detector circuits are input to circuit 380 implementing a subtraction function. The outputs of the synchronous detector circuit outputs are 180 degrees out-of-phase, and so the subtraction operates to remove common mode interference from the two synchronous detector circuit outputs while retaining the sensor signals.

Figure 31:
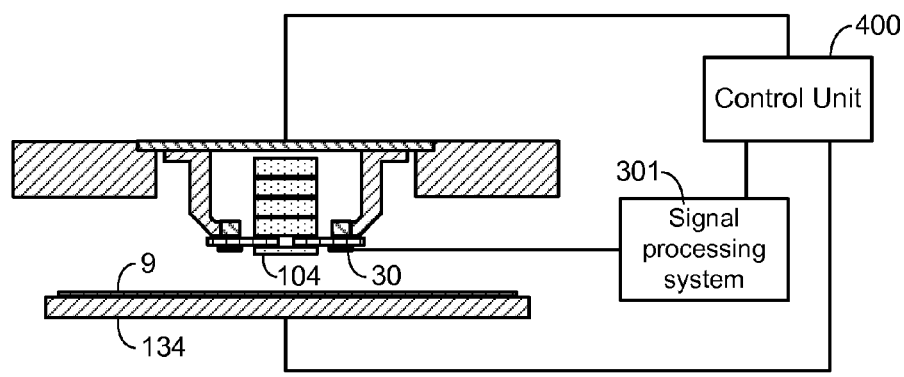
FIG. 31 is a schematic diagram of a control system for positioning of a wafer for a lithography machine.

The capacitive sensors may be used for control of the positioning of a wafer for a lithography machine. FIG. 31 is a schematic diagram of such a control system. The sensors 30 measure a distance related to the distance between the projection lens 104 of the lithography machine and wafer 9 resting on moveable wafer table 134. In this arrangement the sensors are mounted in a fixed relationship to the projection lens, so that the distance between the projection lens and the wafer can be determined from the measured distance between the sensors and the wafer. The sensor signals are transmitted to signal processing unit 301, and the measured data output by the signal processing unit is transmitted to control unit 400. The control unit 400 may be used to control the z-axis (vertical) movement of the wafer table to maintain the wafer in the focal plane of the projection lens of the lithography machine, so that the charged particle beamlets generated by the machine remain focused on the surface of the wafer as the wafer moves in the x and y axis.

The sensor system in conjunction with the control system may be used to accurately determine the distance between the projection lens and the wafer at various points as the wafer is moved. This enables the system to determine the topology of the surface of the wafer, detecting the presence of a tilt or bow in the wafer and other irregularities in the surface of the wafer. The wafer surface is almost never completely flat. A typical wafer may have a bow in it of up to 50 µm without clamping. Apart from the wafer bow the wafer surface may have other non-uniformities over its surface. The wafer bow and other non-uniformities result in height variations in the wafer surface, which result in the wafer surface not being in the focal plane of the projection lens. The control system may be used to correct for this height variation to maintain the wafer surface in the focal plane of the projection lens used to focus the optical or particle exposure beams onto the wafer. The vertical position of the wafer table may be adjusted to compensate for these variations in height of the wafer surface using signals transmitted from the sensors.

The system is designed to measure the topology of the wafer surface while processing (e.g. exposing) the wafer, rather than doing the measurements in advance. This reduces the overall wafer processing time and increases throughput.

Figure 32A:
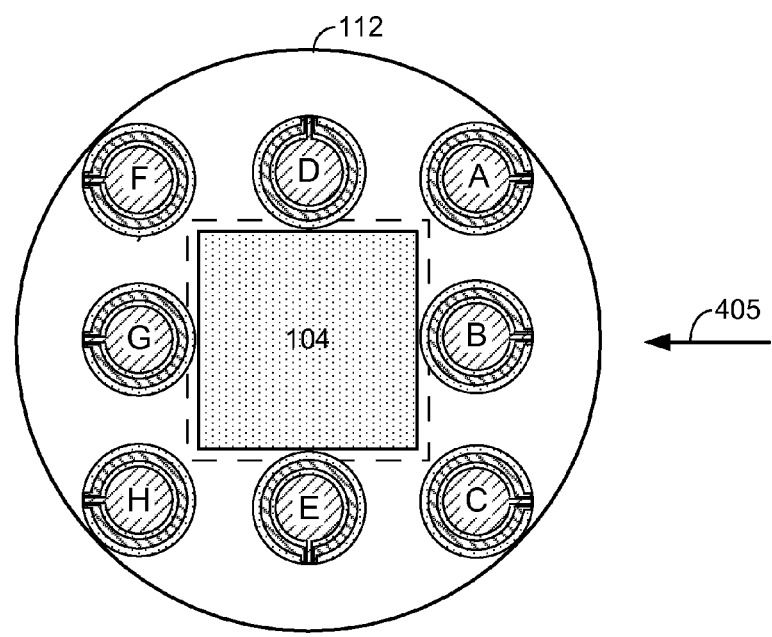
FIGS. 32A and 32B are diagrams of sensor arrangements for use with the control system of FIG. 31.

In one embodiment, an arrangement is used of eight sensors in a square matrix around the projection lens, as shown in FIG. 32A. This arrangement permits a measurement of wafer tilt, wafer bow and other irregularities and the exposure of the wafer to be done in a single scan of the wafer. In a typical arrangement, the wafer is moved in a mechanical scan direction while the optical or charged particle beams of the lithography machine are scanned over the surface of the wafer to expose the wafer according to an exposure pattern.

In the embodiment of FIG. 32A, as the wafer is moved in a mechanical scan direction 405, the first row of sensors A-C measure distance to the wafer surface at three points in a line on the surface of the wafer, corresponding to the sensors A, B and C. The presence and magnitude of a tilt in the wafer position, bow in the wafer, or other surface irregularities can be calculated by comparing the measurement from sensor B with measurements from sensors A and C. The calculated value of the wafer tilt, bow or irregularity along the line is stored in memory in the control system. As the wafer advances in direction 405, the line previously measured by sensors A-C falls under the projection lens 104 and is ready to be exposed. The sensors D and E on either side of the projection lens measure distance to the points on the line previously measured by sensors A and C. The height of the wafer at the point under the projection lens can now be calculated on the basis of the stored value and the current measurements from sensors D and E. The control system can use this calculation of the height of the wafer at the point under the projection lens to adjust the height of the wafer table to ensure the surface of the wafer remains in the focal plane of the projection lens. This enables the compensation for a tilt, bow or other irregularity in the surface of the wafer to be measured and corrected for in a single scan of the wafer.

The third row of sensors F-H are provided to enable the same process described above to be used in both mechanical scan directions, i.e. when the wafer is moving in direction 405 or in the opposite direction. FIG. 32A illustrates a matrix of eight sensors, however the method described above may be implemented with a different number of sensors. Furthermore, each sensor shown in FIG. 32A may be a differential pair of sensors, making a differential measurement at each point A-H.

Figure 32B:
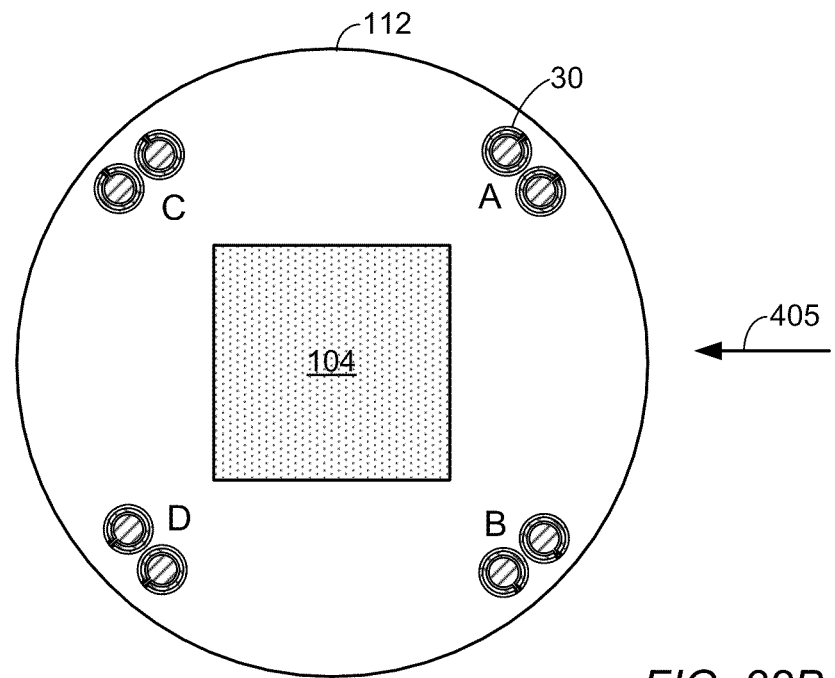

Another embodiment is shown in FIG. 32B having an arrangement of eight sensors in differential pairs at the four corners of a projection lens 104. This arrangement is suitable, e.g. for lithography systems in which the wafer is clamped sufficiently well during exposure to reduce wafer bow to an acceptable value. However, even with a very flat wafer table surface and a good clamp holding the wafer flat against the wafer table, there will still be variation in the wafer surface due to variations in the wafer and the resist layer on its surface. In this embodiment, as the wafer is moved in a mechanical scan direction 405, the first row comprising sensor pairs A and B measure distance to the wafer surface at two points in a line on the surface of the wafer corresponding to the positions A and B. Measurements can also be taken by sensor pairs C and D at positions C and D.

The distance to the wafer at points A, B, C and D, the average distance to the wafer, and the presence and magnitude of a tilt in the wafer (e.g. wafer tilt in the direction of scanning and in other directions) can be calculated, and stored in memory in the control system. From these measurements the distance between the centre of the projection lens 104 and the surface of the wafer can be calculated.

Figure 32C:
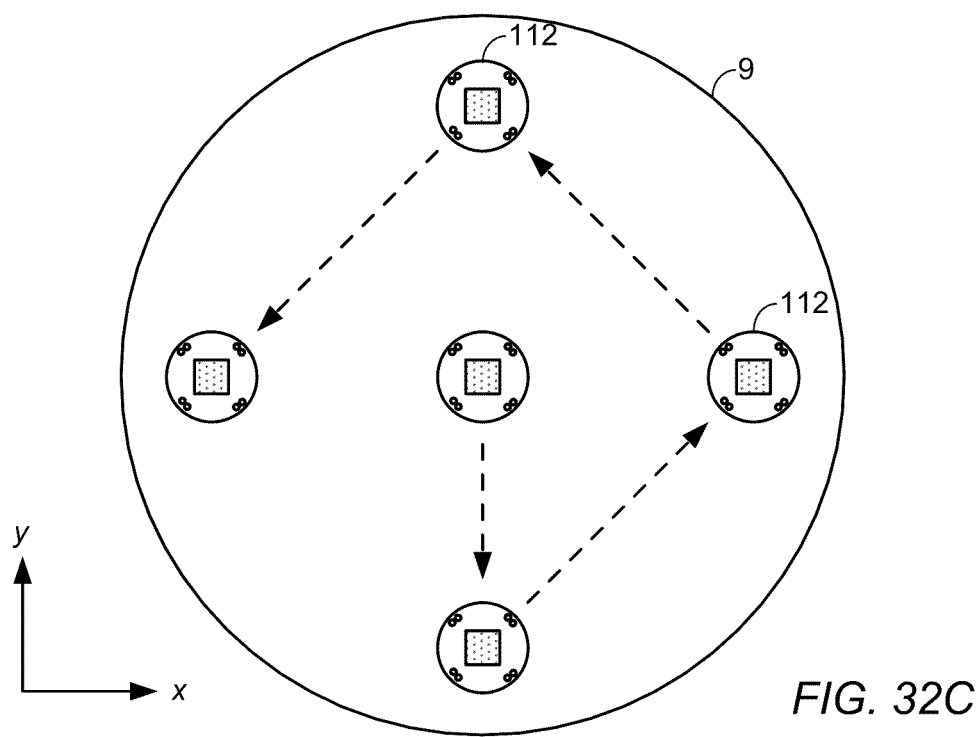
FIG. 32C illustrates a measurement method for determining distance between a projection lens and surface of a wafer.

FIG. 32C illustrates a measurement method for determining distance between a projection lens and the surface of a wafer and tilt values over the surface of the wafer. Prior to exposure, the local gradients of the wafer at several predetermined positions are measured, e.g. in the center and at four equidistant positions around the periphery to the wafer as shown in FIG. 32C. The wafer table is controllable to adjust the tilt Rx of the wafer table in the x-direction and tilt Ry of the wafer table in the y-direction. During the measurements, the tilt Rx and Ry of the wafer table is kept at a constant value.

Using the measurement results, a height map is calculated of the complete area of the wafer to be exposed by a processing unit. From the height map, tilt correction values Rx(x,y) and Ry(x,y) are calculated for actuating the wafer table during exposure, to tilt the wafer table to correct for height variations over the surface of the wafer. A constant tilt correction may be calculated for the entire exposure for the x- and y-directions, i.e. Rx(x,y) is a constant value and Ry(x,y) is a (possibly different) constant value for the exposure. A more complex calculation may also be done where the multiple tilt correction values Rx and Ry are calculated for different regions of the wafer, and the wafer table is adjusted accordingly when each region is being exposed.

During exposure, the tilt of the wafer table in the x- and y-directions is controlled according to the calculated tilt correction values Rx and Ry. This can be accomplished, e.g. using interferometer signals for feedback of the wafer table position and tilt. The level sensors may then be used to generate z-direction data only, i.e. distance between the projection lens and the wafer surface.

This procedure varies from the in-line measuring method described above and an advance wafer mapping method in which the z-direction distance to the wafer is measured at various locations, from which the overall tilting of the wafer surface in x- and y-directions is calculated. The wafer table is then adjusted to optimally correct for any such tilt in advance of the exposure, so as to present a nominally parallel wafer surface to the projector head, transverse to the optical axis of the lithography column, during scanning of the wafer. During scanning the calculated height map of the wafer surface may be used to adapt for variation in the z-direction, i.e. variation in the distance between the projection lens and the wafer surface. The z-direction values may be found directly from the previously determined height map or by using interpolation between measured values.

The invention has been described by reference to certain embodiments discussed above. It should be noted various constructions and alternatives have been described, which may be used with any of the embodiments described herein, as would be know by those of skill in the art. Furthermore, it will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A capacitive sensing system comprising one or more sensors having a thin film structure, the thin film structure comprising
    a first conductive film comprising a separate sensing electrode for each of the one or more sensors;
    a second conductive film comprising a separate back guard electrode for each of the one or more sensors; and
    a first insulating film arranged between the first conductive film and the second conductive film;
wherein the sensing electrode is smaller than the back guard electrode, so that a peripheral portion of the back guard electrode extends laterally beyond the sensing electrode to form a side guard electrode which substantially surrounds the sensing electrode.

2. The capacitive sensing system of claim 1, wherein the thin film structure further comprises an elongated connecting member comprising a flexible membrane on which conductive tracks are printed or affixed, the conductive tracks electrically connected to the sensing electrode and the back guard electrode of the sensor at one end and a connector at the other end.

3. The capacitive sensing system of claim 1, wherein the insulating film comprises a first area where the sensing electrode is formed and a second elongated area on which the conductive tracks are formed.

4. The capacitive sensing system of claim 1, wherein the thin film structure further comprises:
    a third conductive film comprising a shield electrode for one or more of the one or more sensors; and
    a second insulating film arranged between the second conductive film and the third conductive film.

5. The capacitive sensing system of claim 4, wherein the thin film structure further comprises an elongated connecting member comprising a flexible membrane on which conductive tracks are printed or affixed, the conductive tracks electrically connected to the sensing electrode, the back guard electrode, and the shield electrode of the one or more sensors at one end and a connector at the other end.

6. The capacitive sensing of claim 5,
wherein the sensor is mounted to a structure and electrically connected to a triaxial cable, the shield electrode of the sensor being electrically connected to an outer conductor of the triaxial cable for making a connection to ground potential at an end of the cable remote from the sensors, and wherein the shield electrode of the sensor is not electrically connected to the structure at the sensor.

7. The capacitive sensing system of claim 4, wherein the sensor is connected to a triaxial cable, and wherein the shield electrode is electrically connected to an outer ground potential electrical conductor thereof.

8. The capacitive sensing system of claim 4, further comprising an AC power source for energizing the capacitive sensor, a signal processing circuit for processing signals from the sensor, and a triaxial cable for connecting the capacitive sensor to the AC power source and the signal processing circuit, wherein the cable has a center conductor, an outer conductor, and a shield conductor, the center conductor for electrically connecting the AC power source to the sensing electrode of the sensor, the outer conductor for electrically connecting to the back guard electrode of the sensor, and the shield conductor for electrically connecting the shield electrode of the sensor to a ground for the signal processing circuit at an end of the cable remote from the sensors.

9. The capacitive sensing system of claim 1, wherein the one or more sensors are connected to a triaxial cable, and wherein the electrodes of the one or more sensors are connected to corresponding conductors of the triaxial cable via a thin film connector element.

10. The capacitive sensing system of claim 9, wherein the electrodes of the one or more sensors are connected to the conductors of the cable via conductive tracks on the thin film connector element, the conductive tracks electrically connected to at least the sensing electrode and the back guard electrode of the sensor at one end and a connector at the other end.

11. The capacitive sensing system of claim 10, wherein one or more of the conductive tracks electrically connected to the back guard electrode overlies the conductive track connected to the sensing electrode, the conductive tracks electrically connected to the back guard electrode being wider so that a peripheral portion extends out from the edge of the conductive track connected to the sensing electrode.

12. The capacitive sensing system of claim 10, further comprising one or more conductive tracks connected to a shield electrode of the sensor at one end and electrically connected to an outer ground potential electrical conductor of the cable at the other end.

13. The capacitive sensing system of claim 12, wherein one or more of the conductive tracks electrically connected to the shield electrode overlies the conductive track connected to the back guard electrode and the conductive track connected to the sensing electrode.

14. The capacitive sensing system of claim 1, wherein the first insulating film is shared with additional capacitive sensors.

15. The capacitive sensing system of claim 1, wherein the thin film structure is flexible.

16. The capacitive sensing system of claim 1, wherein the first insulating film comprises a Kapton sheet.

17. The capacitive sensing system of claim 1, wherein the first insulating film comprises a pyrex layer.

18. A lithography system for exposing a target, the system comprising:
    a projection lens system for focusing an exposure beam onto the target;
    a moveable stage for carrying the target;
    a capacitive sensing system according to claim 1 for making a measurement related to a distance between the projection lens system and the target; and
    a control unit for controlling movement of the moveable stage to adjust a position of the target based at least in part on a signal from the capacitive sensing system.

19. The capacitive sensing system of claim 1, wherein the capacitive sensing system comprises one or more pairs of sensors, each sensor comprising a separate sensing electrode and a separate back guard electrode.

20. The capacitive sensing system of claim 1, wherein the one or more sensors are free of a side guard electrode.

* * * * *